(12) United States Patent
Goepel

(10) Patent No.: US 9,413,273 B2
(45) Date of Patent: Aug. 9, 2016

(54) ROTARY ACTUATOR

(71) Applicants: Fraunhofer-Gesellschaft zur Foerderung der angewandten Forschung e.V., Munich (DE); Andreas Kappel, Brunnthal (DE)

(72) Inventor: Ernst Goepel, Gauting (DE)

(73) Assignees: FRAUNHOFER-GESELLSCHAFT ZUR FOERDERUNG DER ANGEWANDTEN FORSCHUNG E.V., Munich (DE); ANDREAS KAPPEL, Brunnthal (DE)

( * ) Notice: Subject to any disclaimer, the term of this patent is extended or adjusted under 35 U.S.C. 154(b) by 240 days.

(21) Appl. No.: 14/345,494

(22) PCT Filed: Sep. 18, 2012

(86) PCT No.: PCT/EP2012/003895
§ 371 (c)(1),
(2) Date: Mar. 18, 2014

(87) PCT Pub. No.: WO2013/041212
PCT Pub. Date: Mar. 28, 2013

(65) Prior Publication Data
US 2014/0355093 A1    Dec. 4, 2014

(30) Foreign Application Priority Data
Sep. 19, 2011 (DE) .................. 10 2011 113 760

(51) Int. Cl.
| G02B 26/08 | (2006.01) |
| G02B 7/00 | (2006.01) |
| G02B 27/01 | (2006.01) |
| H01L 41/053 | (2006.01) |
| H02N 2/14 | (2006.01) |
| H02N 2/04 | (2006.01) |
| G05G 23/00 | (2006.01) |

(52) U.S. Cl.
CPC ............... *H02N 2/123* (2013.01); *G02B 7/005* (2013.01); *G02B 27/0149* (2013.01); *H01L 41/053* (2013.01); *H01L 41/0533* (2013.01); *H01L 41/0536* (2013.01); *H02N 2/043* (2013.01); *H02N 2/046* (2013.01); *H02N 2/10* (2013.01); *H02N 2/14* (2013.01); *G05G 23/00* (2013.01)

(58) Field of Classification Search
CPC .......... G02B 26/0833; G02B 26/0841; G02B 26/085; G02B 26/0858; G02B 27/0149; G02B 7/005; H02N 2/0123; H02N 2/14; H02N 2/103; H02N 2/046; H02N 2/004; H01L 41/053; H01L 41/0536
USPC .......... 359/198.1–199.4, 200.6–200.8, 221.2; 310/311, 328, 348
See application file for complete search history.

(56) References Cited

U.S. PATENT DOCUMENTS

| 3,035,126 A | 5/1962 | Crownover |
| 5,626,312 A | 5/1997 | Head |

FOREIGN PATENT DOCUMENTS

DE    40 33 089 C1    3/1992

*Primary Examiner* — James Phan
(74) *Attorney, Agent, or Firm* — Fitch, Even, Tabin & Flannery LLP

(57) ABSTRACT

The present invention is a rotary actuator having segments, which are spaced apart and are connected by means of at least one support structure, and at least one actuator for exerting forces, characterized in that the support structure is substantially rotationally symmetrical about an axis and is composed of elements which are not oriented parallel to the axis or which are twisted through an angle in relation to the axis, and the elements can be changed by rotation about the axis and the actuator can exert forces to at least one of the segments and the support structure in the direction of the axis.

25 Claims, 20 Drawing Sheets

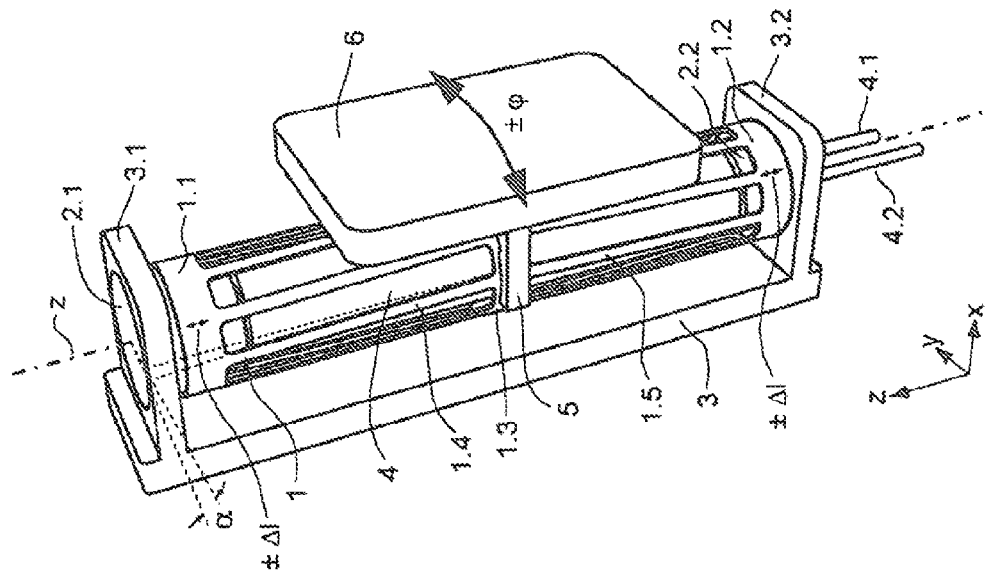
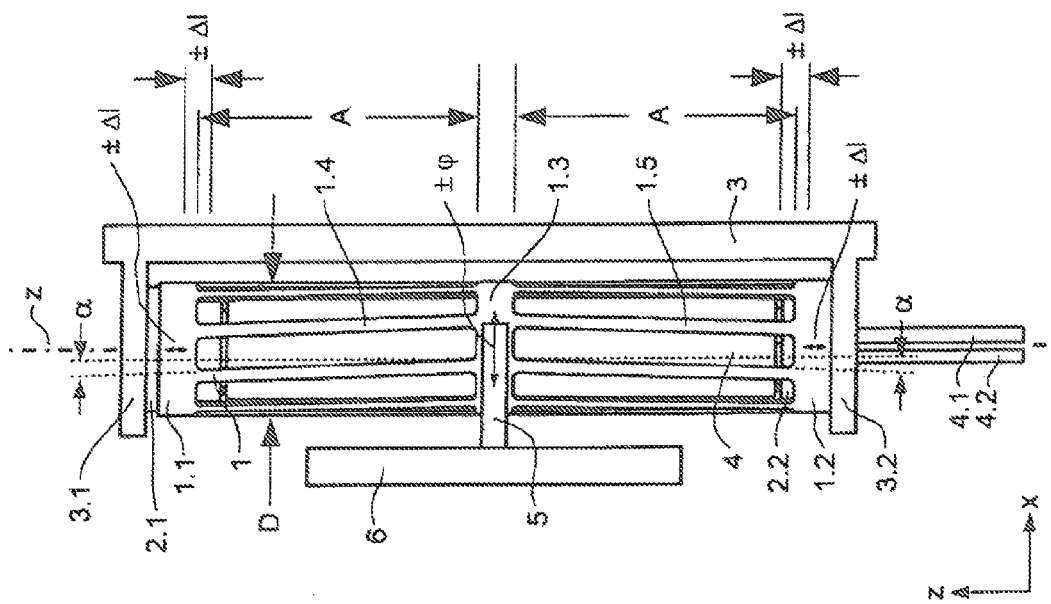

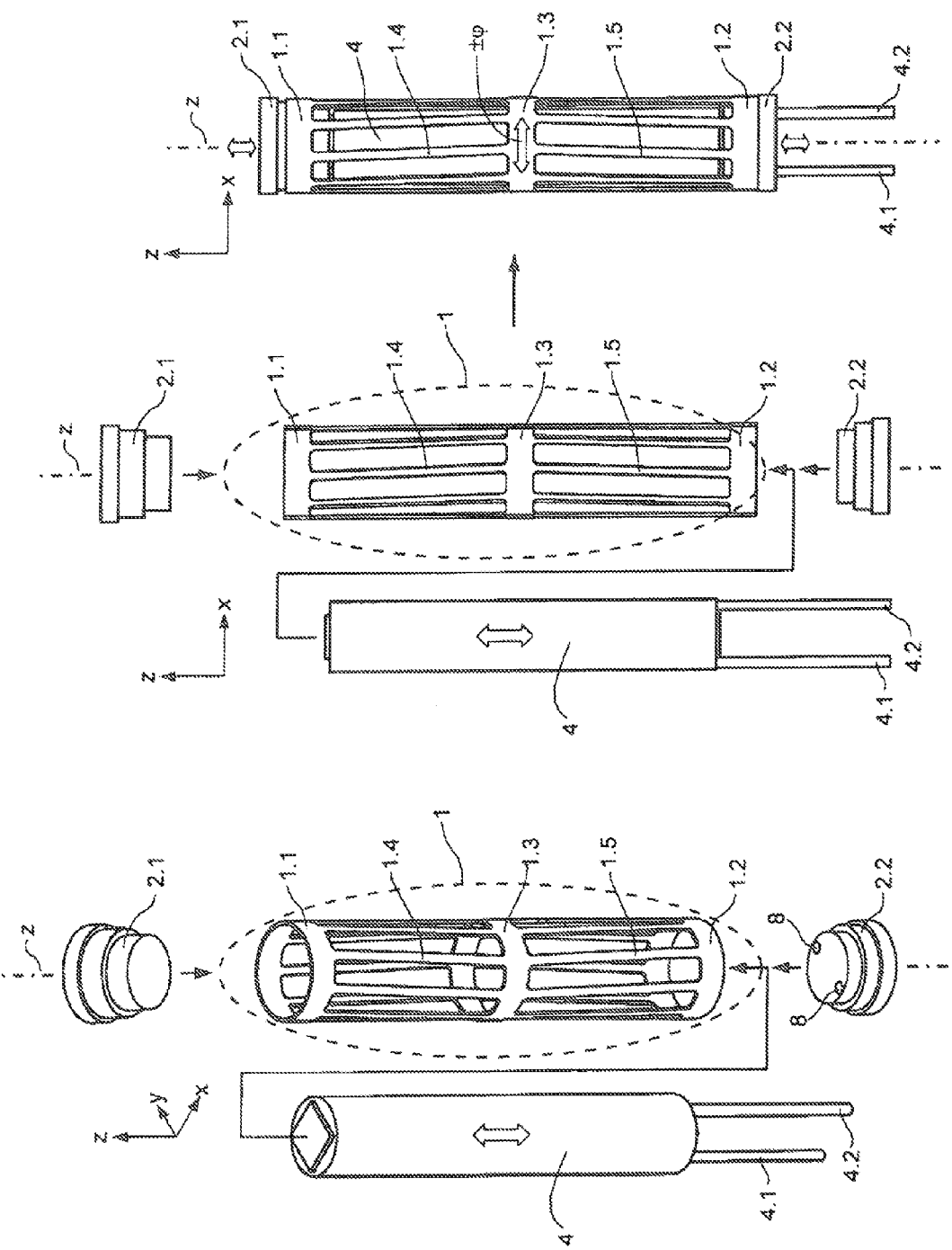

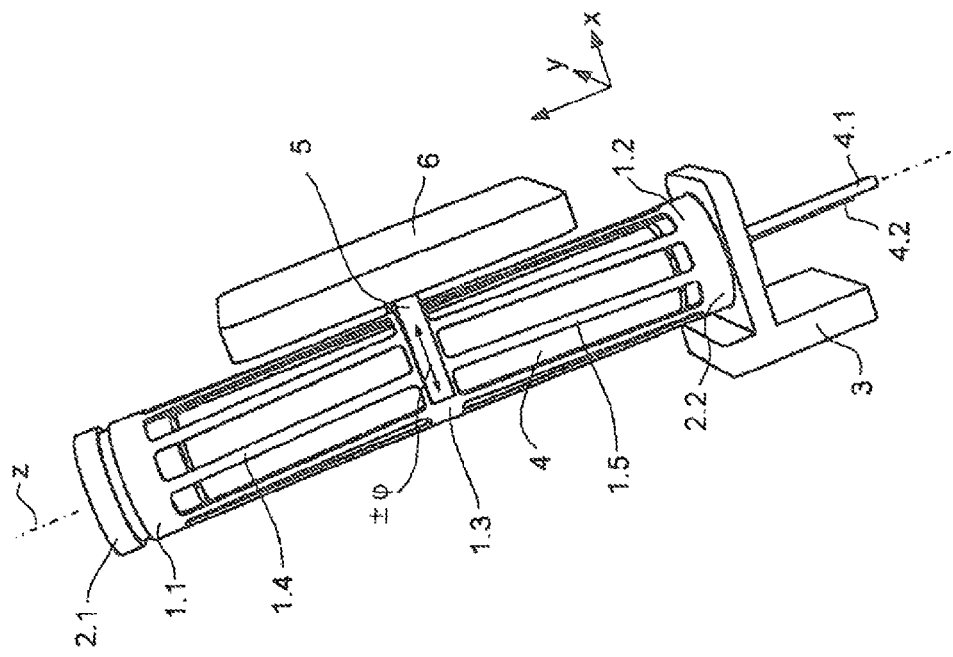
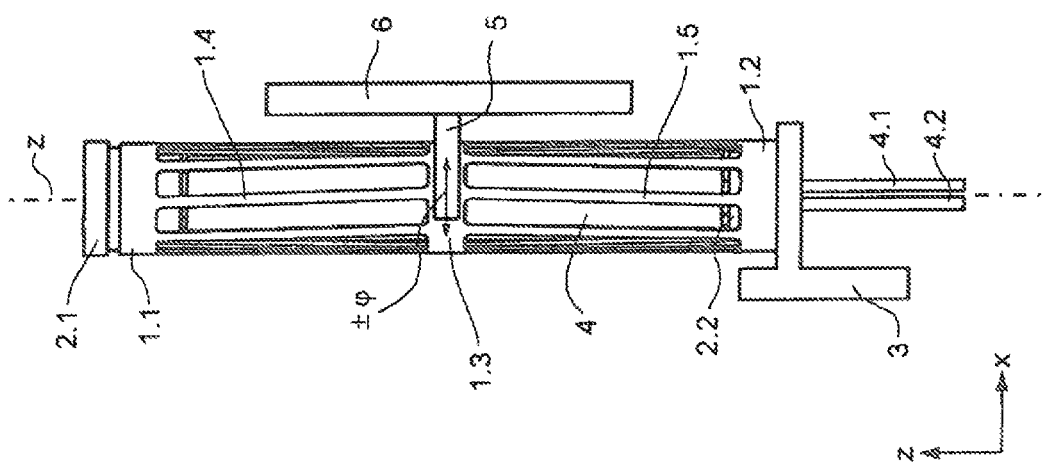

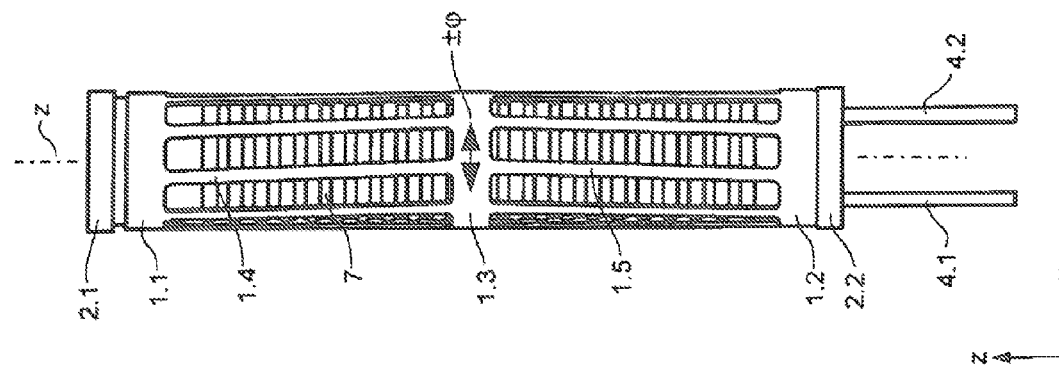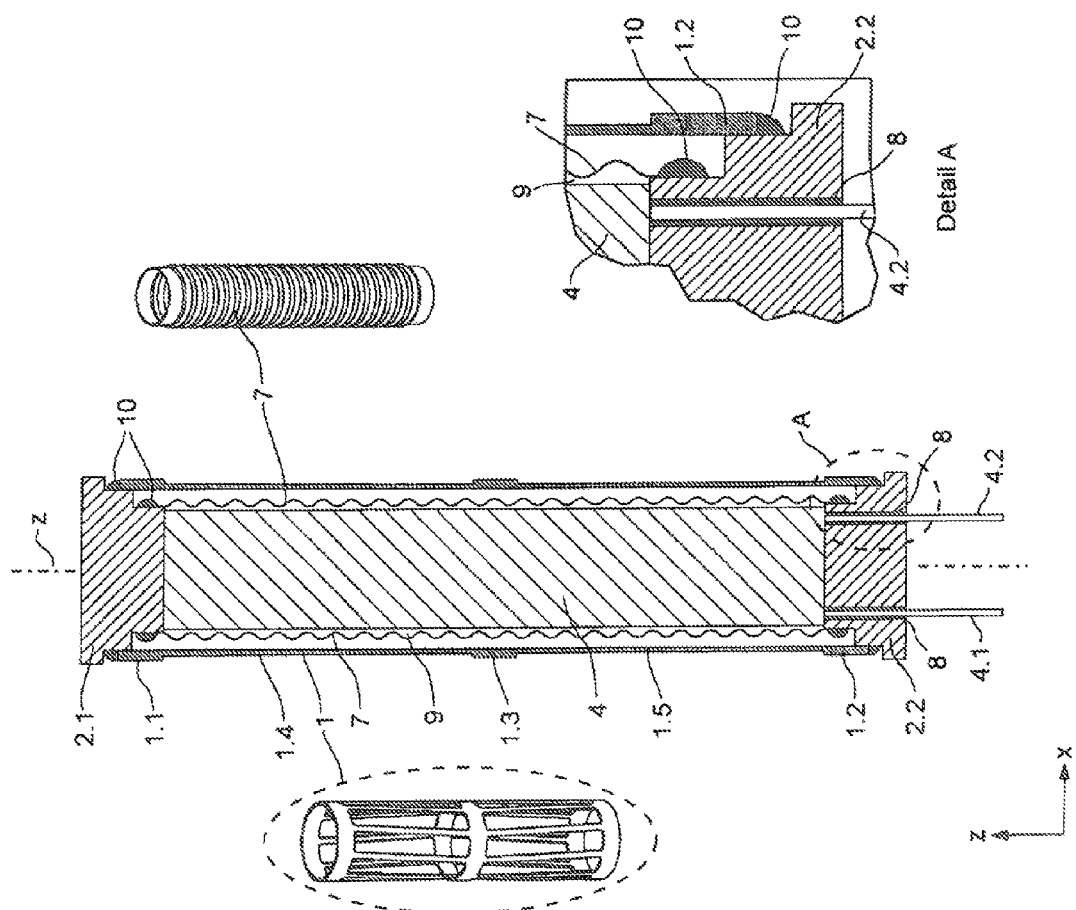

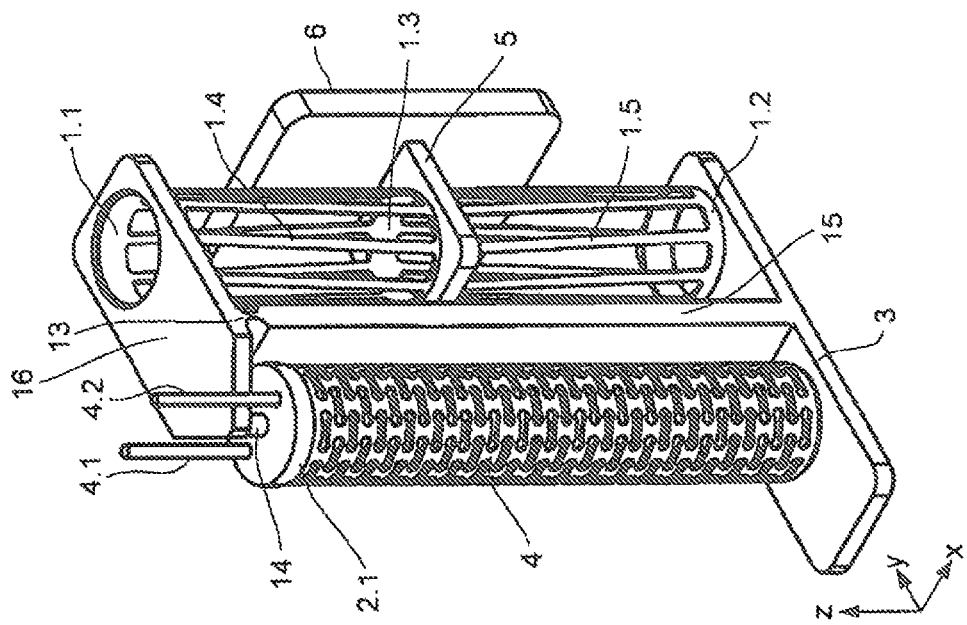
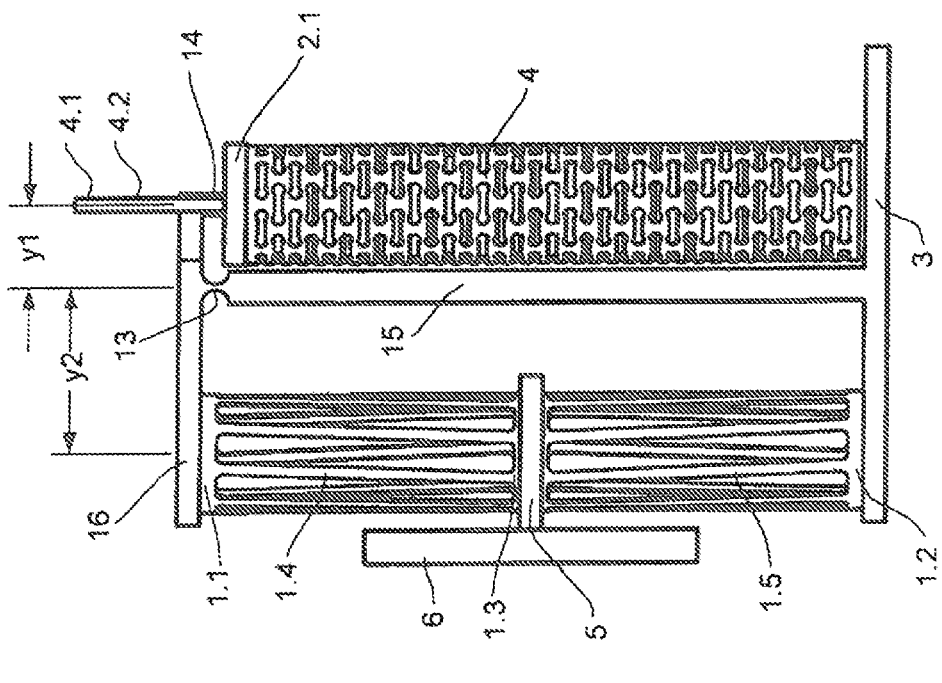
Fig. 18. a.)
Fig. 18. b.)

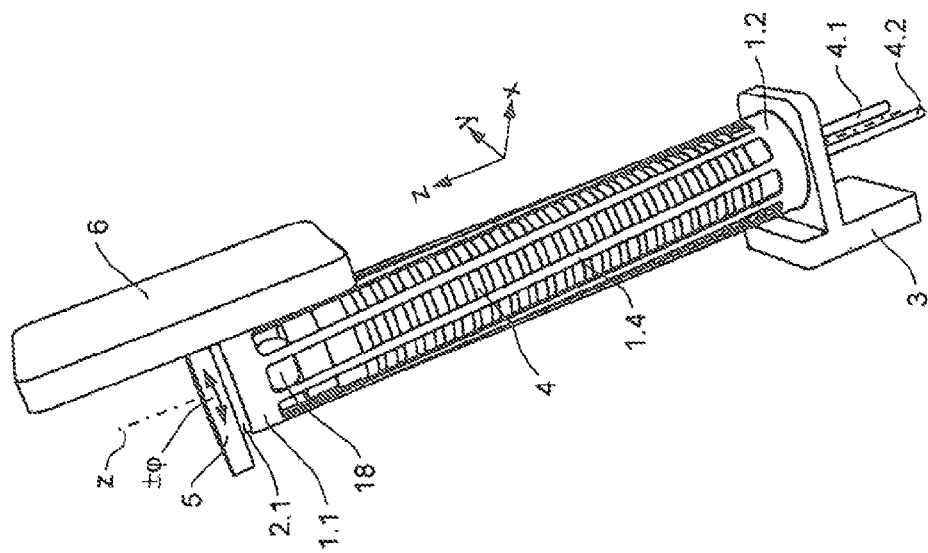
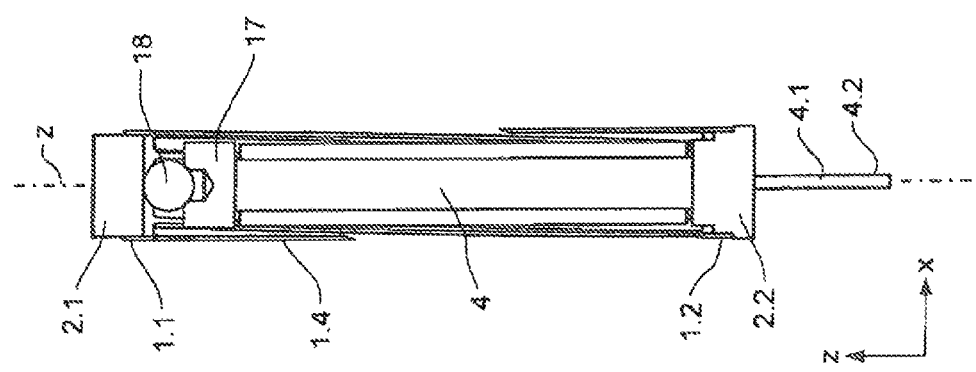
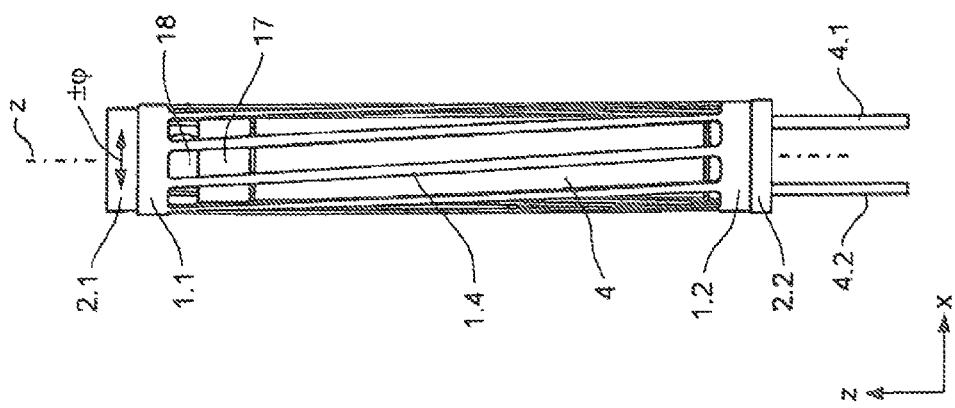

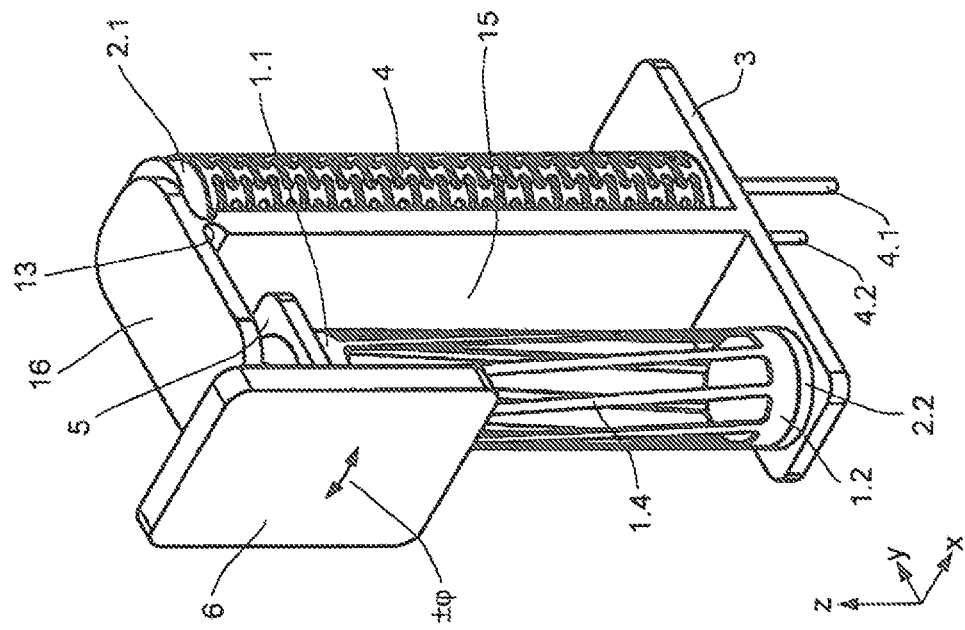
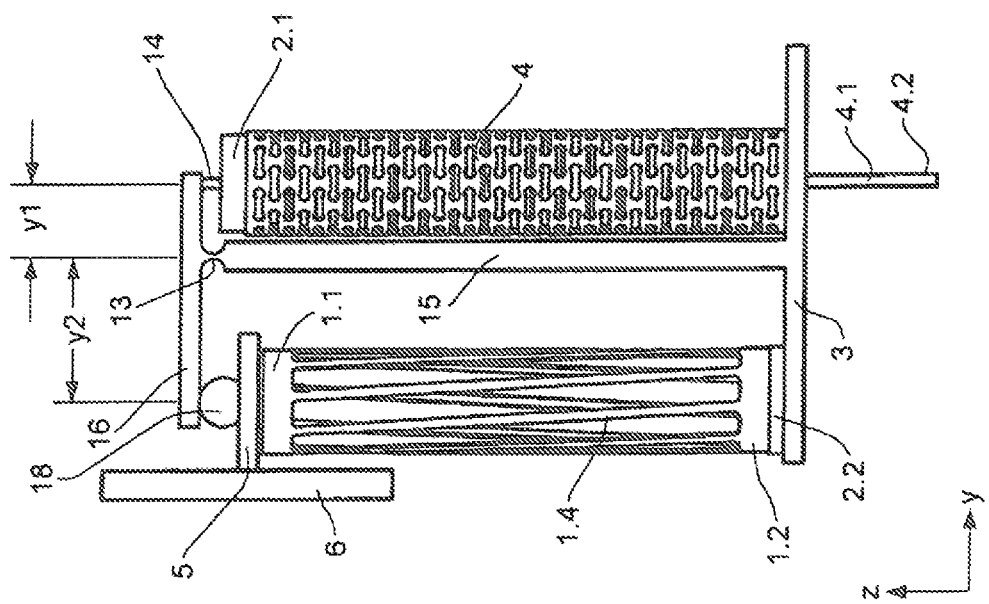

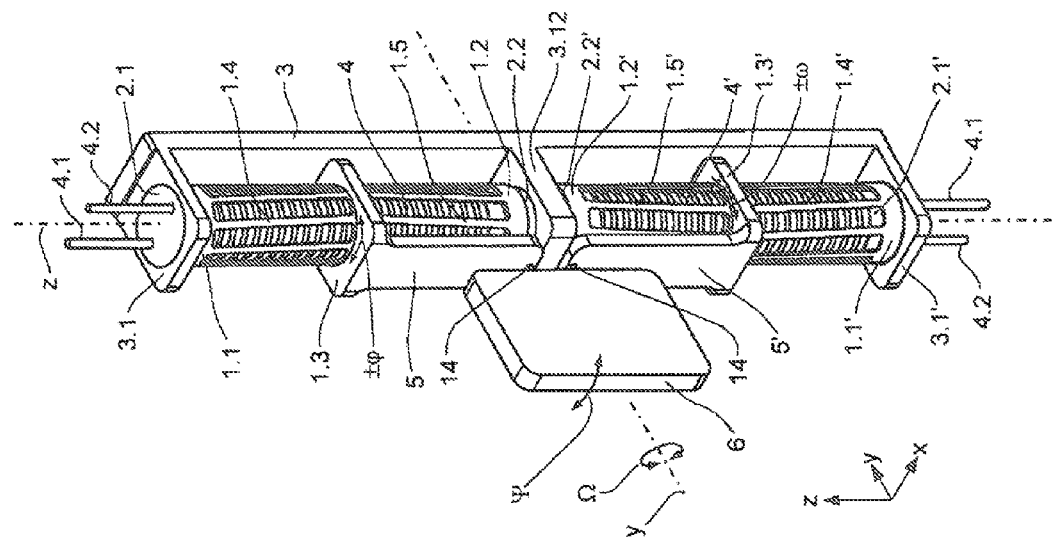
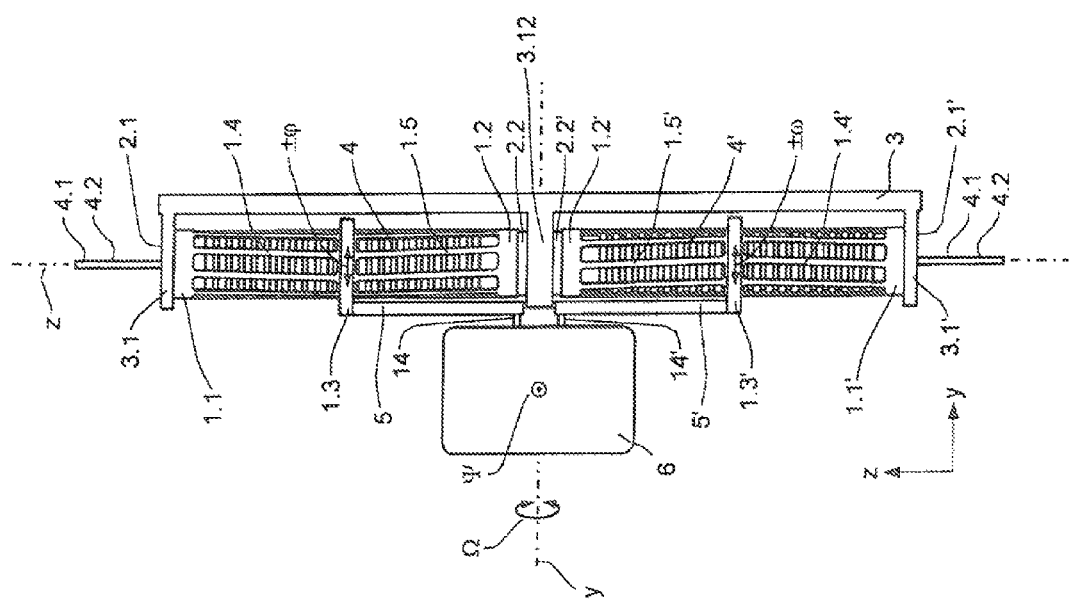

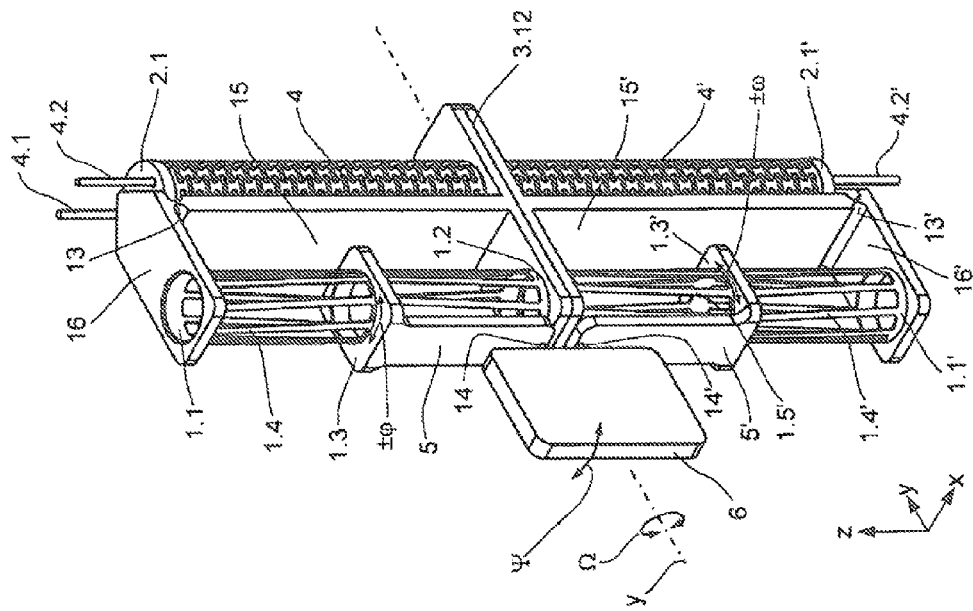
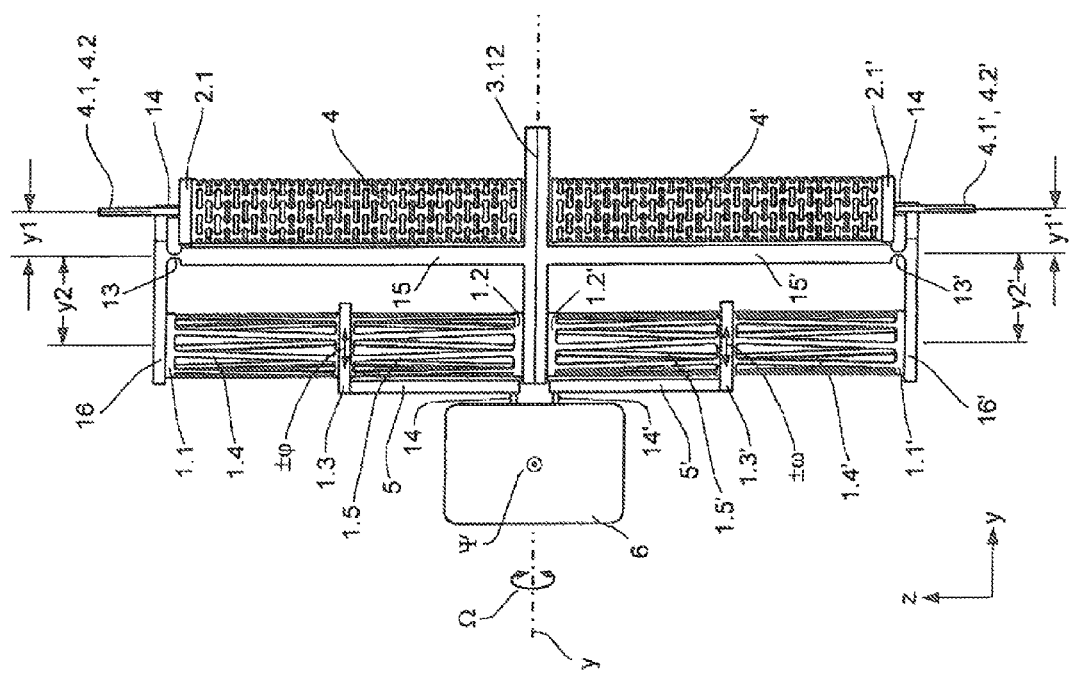

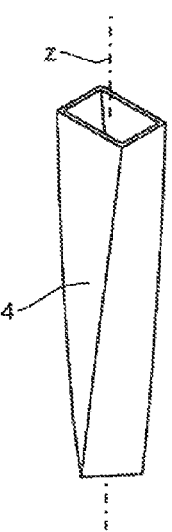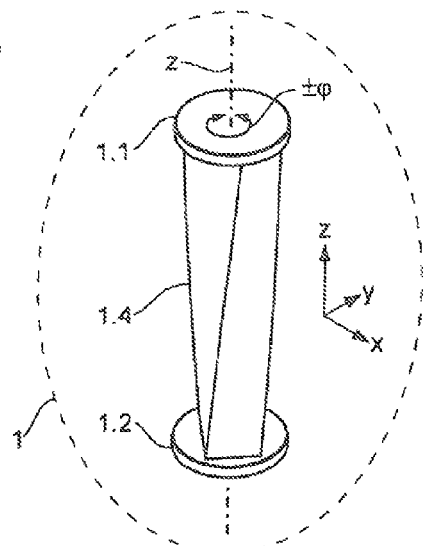
Fig.23 a.)
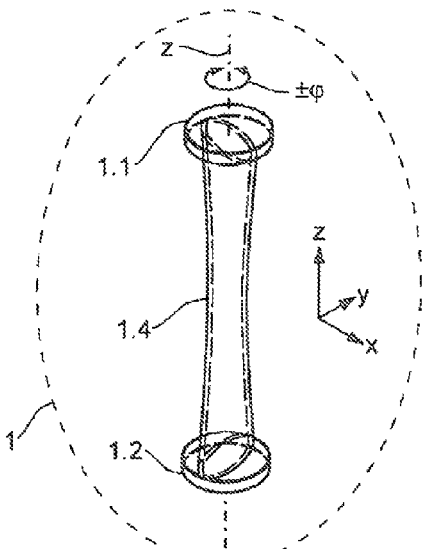
Fig.23 b.)
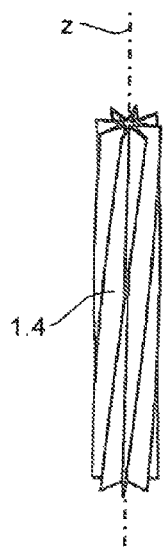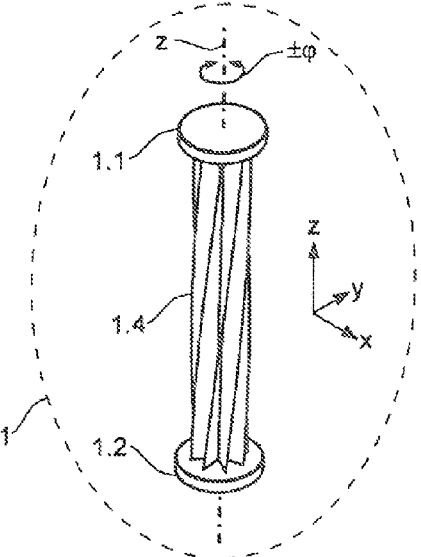
Fig.23 c.)

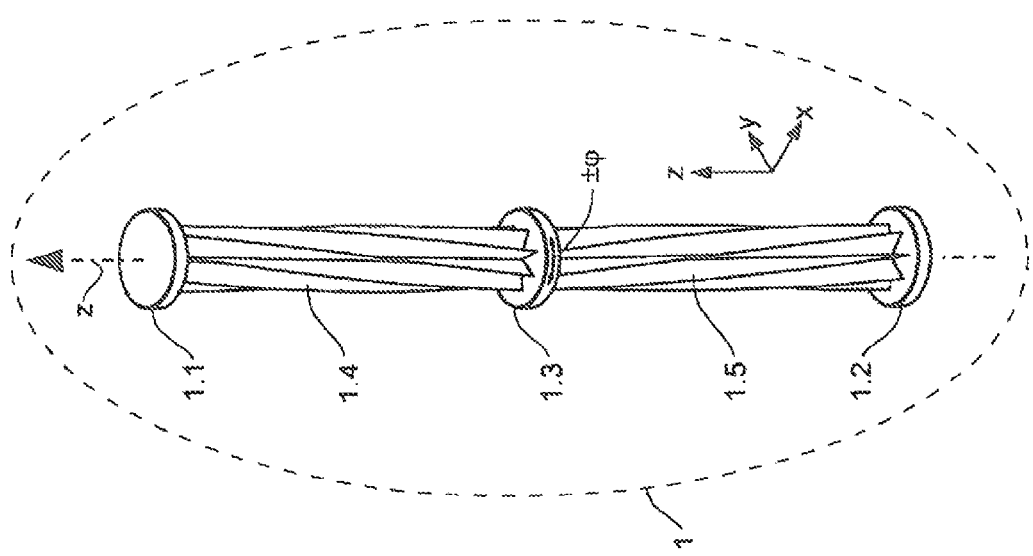
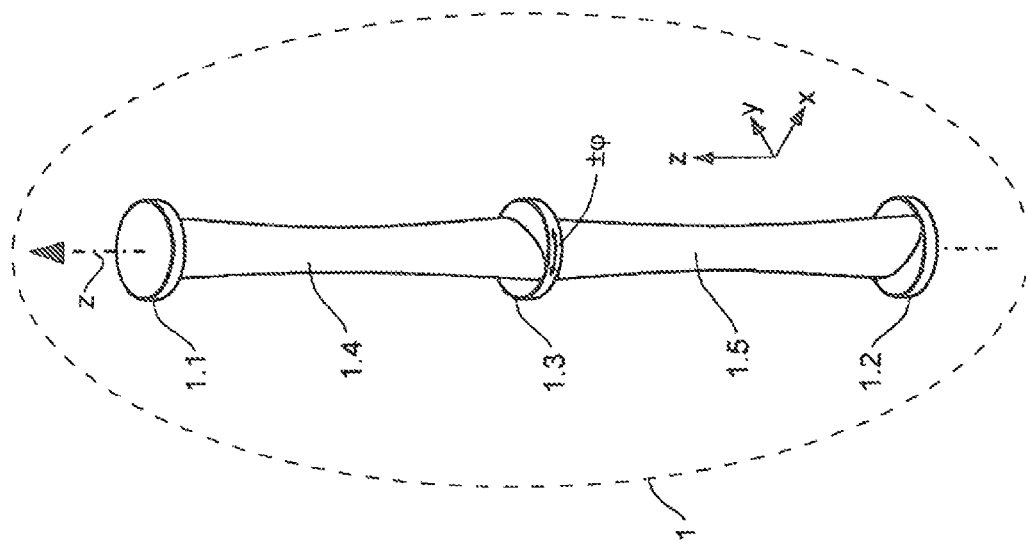
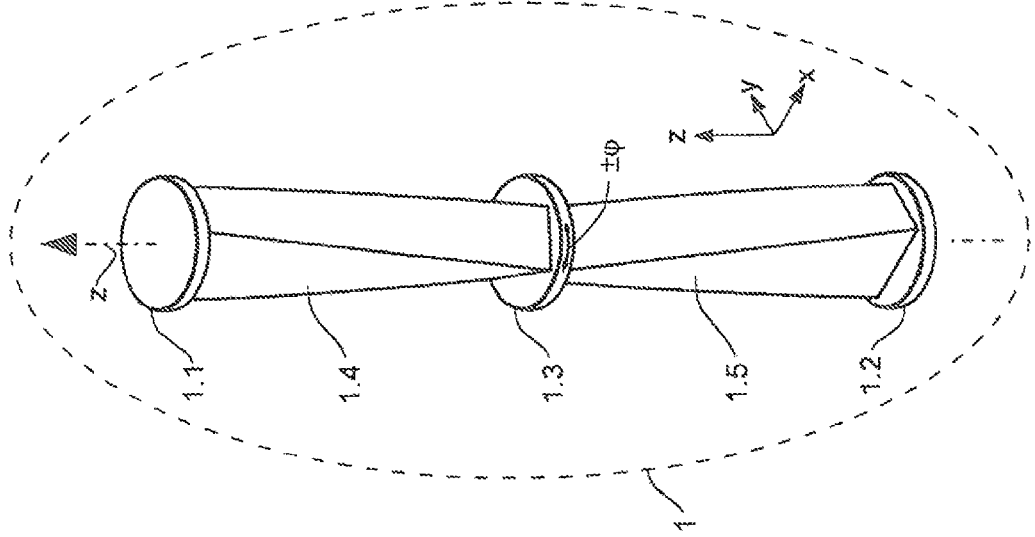

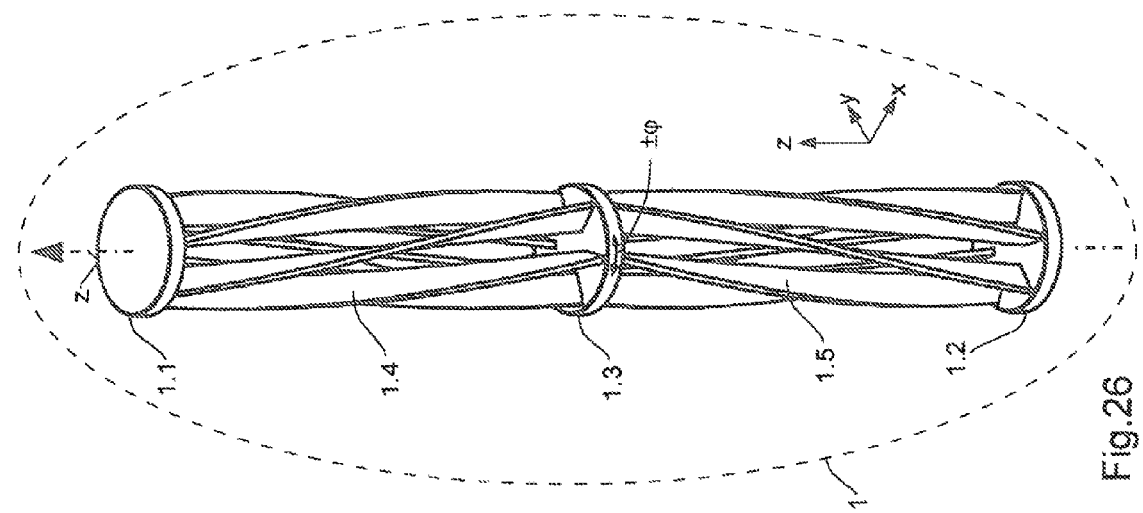
Fig.26
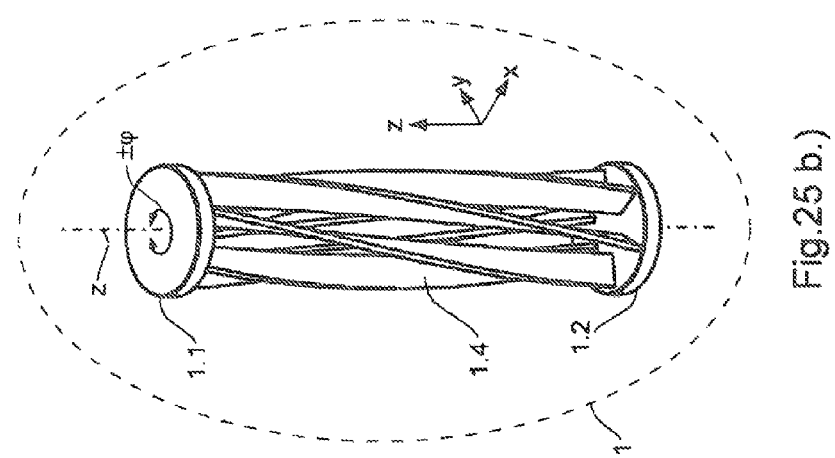
Fig.25 b.)
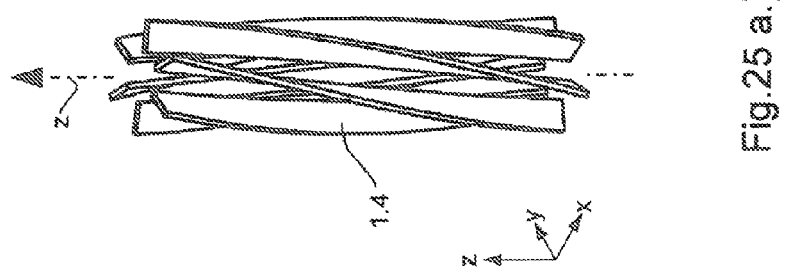
Fig.25 a.)

ROTARY ACTUATOR

CROSS REFERENCE TO RELATED APPLICATION

Reference is made to German Application Serial No. 10 2011 113 706.6, filed Sep. 19, 2011, which application is incorporated herein by reference in its entirety.

BACKGROUND OF THE INVENTION

1. Field of the Invention

The present invention relates to an electrical drive, hereinafter designated as a rotary actuator and in particular, a rotary actuator that can easily be controlled and regulated, which is distinguished by high accuracy, a high dynamic response and a compact build.

2. Description of the Prior Art

In many technical sectors the necessity exists for control of the movement or manipulation of objects by electrical control. Here the required movement of the objects can be a linear movement, a rotational movement, or a movement ensuing from the superposition of linear and rotational movements, in particular a movement along any trajectory. In many cases the requirement exists for the execution of rotational movements, or pivotal movements of a rotational nature, of objects, wherein the rotational movement in many cases is limited to a range of angles, but is to take place in as dynamic and accurate a manner as possible. Examples of applications of such requirements are found in the sectors of optics, mechanics, hydraulics, pneumatics and electrically powered devices. Optical deflection units are widely used; in these an optical element, for example a mirror, a lens, or an aperture, is pivoted into the optical path, or rotated in the optical path. Such deflection systems or deflection units find technical application in, inter alia, laser beam cutting processes, in laser printers as scanning mirrors, or in optical projection systems, such as head-up displays (HUD) for purposes of adjustment of the projection mirror and lenses. Tracking systems are a further field of application.

Also in the hydraulics and pneumatics sectors rotationally moved valve elements are often introduced alongside linearly moved valve elements, in order, for example, to be able to open and close an electrically controlled inlet or outlet. For purposes of proportional control of a volumetric fluid flow the valve elements must not only be able to open and close the fluid opening completely, but must be able to assume any intermediate position.

Pivotal and rotational devices are also widely used in the sectors of automation technology, production technology and medical technology, where they serve to manipulate and/or transfer objects, such as in automatic placement machines, or serve as switches that can be electrically actuated. In the four- and two-wheeled motor vehicle sectors, actuators of this type can be introduced into gearbox transmissions, or in the case of bicycles and/or electrical bicycles can be introduced for the electrical actuation of the derailleur gear for a chain transmission.

The technical problem and challenge for such electrical rotary actuators is in the adjustment of objects that are subject to inertia and mass with a high dynamic response, but also with accuracy.

Today galvanometers or galvanometer scanners are mainly deployed for purposes of optical beam deflection; these have a low mass mirror and an electrical deflection unit, usually electromagnetic or electrostatic in nature, for the mirror. With low inertia mirrors a high dynamic response and high accuracy can be achieved. A high dynamic response and accurate movement of objects of greater mass are not possible with such systems. Thus the field of deployment of galvanometer deflection systems is severely limited.

For the rotational activation of objects of greater mass electromagnets or electric motors are used in accordance with prior art. Here, however, a conflict of objectives exists between highest possible dynamic response and highest possible accuracy, in that only one of the objectives can be optimized at a time to the detriment of the other. The electrical rotational and pivotal drives that can be found commercially represent in this regard a compromise between the accuracy required and the dynamic response that can be achieved.

SUMMARY OF THE INVENTION

The present invention provides a rotary actuator controlled electrically that enables adjustment of the angle of rotation of objects of significant mass with a high dynamic response and very high accuracy.

In accordance with the invention a rotary actuator is provided that has in particular the following features:

- At least one rotary converter has at least two end regions, which are connected with one another with reference to a longitudinal axis of non-parallel oriented structures.
- At least one actuator exercises linear forces on the at least one rotary converter in the direction of the longitudinal axis.
- At least one element attaches at least one first region of the rotary converter to an inertial system.
- At least one element attaches at least one second region of the rotary converter to an object.

such that in the event of the rotary converter being subjected to forces in the direction of the longitudinal axis, the at least one first region and the at least one second region of the rotary converter rotate relative to one another.

An inventive rotary converter can in particular:

- Have a hollow body, the wall of which has arms, which are oriented in a rotationally symmetrical manner on the periphery of the hollow body at an angle with reference to a longitudinal axis of the hollow body, and are connected with end regions. Such a rotary converter can for example be manufactured from a hollow cylinder or a hollow cone by the introduction of slots into the wall of the hollow body.
- Have bar-type connections of any shape and any cross-section in the end regions, wherein the bar-type connections are oriented to be inclined and rotationally symmetrically at an angle with reference to a longitudinal axis. Such a lattice-type rotary converter can, for example, be manufactured from two ring or disk-shaped end regions by the attachment of bars that are inclined at an angle relative to the longitudinal axis.
- Have solid or hollow profiles twisted along a longitudinal axis, wherein any profile cross-sections are possible. In particular, the profile cross-sections can possess different dimensions along the longitudinal axis, so they can broaden or taper down, or one profile cross-section can merge into another, as long as the direction of rotation/turn of the twist does not vary. Here the end regions of the rotary converter are formed by the ends of the twisted bar or hollow profiles.
- Have combinations of two or more individual rotary converters of the above-described type. For example, a first rotary converter with a left-hand direction of rotation/turning can with its one end region be mechanically connected axially with the end region of a second rotary converter with a right-hand direction of rotation/turning, such that the point of connection represents an equator, which, in the event of the end regions of the combined rotary converter being subjected to forces in the direction of the longitudinal axis, the converter rotates relative to the end regions.

In a preferred embodiment the rotary actuator has:

At least one tube-shaped structure serves as a rotary converter with the wall having strip-shaped arms, which are oriented on the periphery of the tube-shaped structure at an angle relative to its longitudinal axis.

Ring-shaped regions of the at least one tube-shaped structure having the ends of the strip-shaped arms connected with one another, which also are designated as attachment regions.

The strip-shaped arms are designed such that these are stiff with respect to movements of the ring-shaped attachment regions in the direction of the longitudinal axis of the tube-shaped structure, but are flexible relative to rotations about the longitudinal axis of the tube-shaped structure.

At least one mounting for the at least one tube-shaped structure, is preferably located on one of the attachment regions At least one attachment element for an object to be rotated, is located on the at least one tube-shaped structure, preferably on one of the attachment regions.

At least one actuator that can be electrically actuated, which, in response to electrical signal voltages, exerts forces proportional to the amplitude and/or the polarity of the electrical signal voltages onto the ends, in particular onto the attachment regions of the arms, of the at least one tube-shaped structure on its longitudinal axis.

Therefore, the forces exerted by the actuator onto the ends of the tube-shaped structure provide proportional alterations in the length of the tube-shaped structure, as a result of which the angle of the strip-shaped arms on the periphery of the tube-shaped structure changes relative to its longitudinal axis and at least one of the ring-shaped attachment regions of the strip-shaped arms rotates about the longitudinal axis of the tube-shaped structure as an axis of rotation, relative to at least one of the other ring-shaped attachment regions of the strip-shaped arms.

The inventive rotary actuator enables the rotational movements of the objects connected thereto within a range of angles, with a very high dynamic response and high accuracy. In particular the inventive rotary actuator is distinguished by a low inertia, a high drive stiffness and a compact build.

In what follows the regions on which the arms, the bar-type connections or the twisted profiles are attached or articulated are also designated as end regions, attachment regions or segments. The individual arms or the individual bar-type connections of the individual twisted profiles are also designated as elements, and the elements that connect the two segments with one another are also designated as the support structure.

BRIEF DESCRIPTION OF THE DRAWINGS

The rotary actuator of the invention is explained in an exemplary manner on the basis of a number of figures. Here the same reference symbols correspond to the same or analogous elements. The inventive features shown in the examples can also be independent of the specific example.

FIG. 1 illustrates a rotary actuator in accordance with the invention being a hollow cylindrical rotary converter with support structures having strip-shaped arms, which are arranged symmetrically with respect to a central equator plane and which surround the actuator.

FIG. 2 is a perspective view of the rotary actuator in FIG. 1.

FIG. 8a) is a perspective view of components of a rotary actuator.

FIG. 8b) is a planar view of components of a rotary actuator.

FIG. 8c) illustrates a rotary actuator in the assembled state, but without a mounting and without a working load.

FIG. 9 a) illustrates a rotary actuator in the assembled state, with a mounting and a working load.

FIG. 9b) illustrates a perspective view of the rotary actuator in FIG. 9a).

FIG. 10 illustrates a cross-sectional representation of a rotary actuator with an hermetically encapsulated actuator.

FIG. 11 illustrates a view of the rotary actuator including an hermetically encapsulated actuator of FIG. 10 in the assembled state.

FIG. 18a) illustrates a rotary actuator with an externally located rotary converter and lever transmission.

FIG. 18b) illustrates a perspective view of the rotary actuator of FIG. 18a).

FIG. 19a) illustrates a rotary actuator with a rotary converter with only one support structure in a side view.

FIG. 19b) illustrates a cross-sectional representation of the rotary actuator shown of FIG. 19a).

FIG. 19c) illustrates a perspective view of the rotary actuator shown of FIG. 19a).

FIG. 20a) illustrates a rotary actuator with an externally located rotary converter and lever transmission acting at one end.

FIG. 20b) is a perspective view of the rotary actuator in FIG. 20a).

FIG. 21a) illustrates a two-axis rotary actuator.

FIG. 21b) is a perspective view of the rotary actuator FIG. 21a).

FIG. 22a) illustrates a two-axis rotary actuator with externally located rotary converters and a lever transmission.

FIG. 22b) is a perspective view of the rotary actuator of FIG. 22a).

FIG. 23a) illustrates a rotary converter being a box-shaped hollow profile as a support structure.

FIG. 23b) illustrates a rotary converter having an elliptical hollow profile as a support structure.

FIG. 23c) illustrates a rotary converter having a star-shaped solid profile as a support structure.

FIG. 24a) illustrates a double-acting rotary converter having two box-shaped hollow profiles as support structures.

FIG. 24b) illustrates a double-acting rotary converter having two elliptical hollow profiles as support structures.

FIG. 24c) illustrates a double-acting rotary converter with two star-shaped solid profiles as support structures.

FIG. 25a) illustrates a support structure of a rotary converter including spiral-shaped curved strips.

FIG. 25b) illustrates a rotary converter, having support structure of spiral-shaped curved strip-shaped arms which are connected with disk-shaped segments.

FIG. 26 illustrates a rotary converter having two support structures of spiral-shaped curved strip-shaped arms having a mirror symmetry with respect to a central segment.

DETAILED DESCRIPTION OF THE INVENTION

Figure 3:
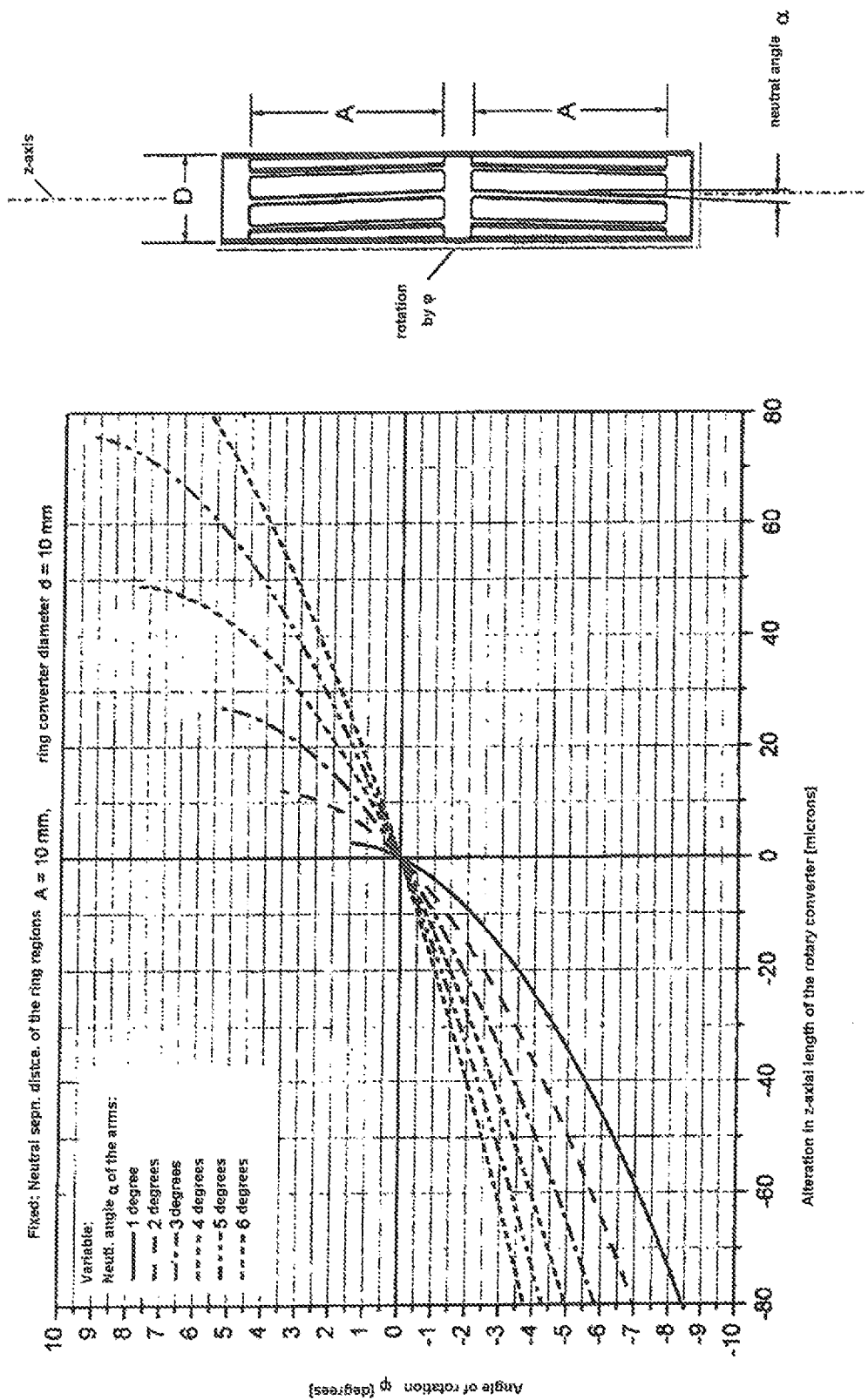
FIG. 3 is a graph of the angle of rotation for various neutral angles of the arms of a rotary converter.

FIG. 1 shows a first example of embodiment of a rotary actuator in plan view. FIG. 2 shows the rotary actuator in FIG. 1 in a perspective view. The rotary actuator represented in FIG. 1 and FIG. 2 has as a rotary converter 1 which is a hollow cylindrical support structure that is rotationally symmetrical about a longitudinal axis z, with two ring-shaped segments 1.1 and 1.2 at either end, and also a central ring-shaped segment 1.3. The segments 1.1 and 1.2 at either end are connected by arms 1.4 and 1.5 with the central segment 1.3, which is also designated as the equator region. The arms 1.4 and 1.5 form an outer wall-shaped boundary of the rotary converter 1 with the diameter D. The segments 1.1 and 1.2 at either end are spaced apart from the central segment 1.3 along the longitudinal axis z by the dimension A. In an initial position of the rotary actuator with no current flowing, the arms 1.4 and 1.5 are oriented on the periphery of the rotary converter 1 such that they subtend an angle α with the longitudinal axis z of the rotary converter 1 projected onto the periphery. The central segment 1.3 lies in a plane at right angles to the longitudinal axis z of the rotary converter 1, with respect to which plane the arms 1.4 and 1.5 are arranged in a mirror image. As shown in FIG. 1 and FIG. 2, the individual arms 1.4 relative to one another have an essentially parallel orientation on the periphery of the rotary converter 1. Similarly the individual arms 1.5 are oriented essentially parallel relative to one another on the periphery of the rotary converter 1.

On at least one of its segments 1.1 and 1.2 at either end the rotary converter 1 can be connected via end caps 2.1 and 2.2 with flanges 3.1 and 3.2 of a mounting 3. The rotary converter 1 can be connected with the mounting 3 with one or both of the segments at either end. In the case in which the rotary converter 1 is attached at both ends to the flanges 3.1 and 3.2 of the mounting 3, represented in an exemplary manner in FIG. 1, the latter are in particular embodied such that the mounting 3 with its flanges 3.1 and 3.2 opposes any changes in length of the rotary converter 1 in the direction of the z-axis with as little mechanical resistance as possible. To this end one of the end caps 2.1 and 2.2 of the rotary converter can be mounted such that it can move in the z-direction in a guide of the mounting 3, and/or the flanges 3.1 and 3.2 can consist of plates that are flexible in bending, and/or the mounting 3 by an appropriate design and/or choice of material can have mechanical flexibility in the direction of the z-axis. It is essential for the function of the rotary converter 1 that this can lengthen and shorten along the z-axis. In particular, a mounting 3 that is connected with both segments 1.1 and 1.2 at either end is embodied such that this movement is constrained as little as possible, although the rotary converter 1 is connected with the mounting 3 such that it does not easily rotate.

For the generation of axial forces acting in the z-direction on the segments 1.1 and 1.2 at either end of the rotary converter 1, the rotary converter 1 has at least one actuator 4, which can be supported in the z-direction on end caps 2.1 and 2.2 that are securely connected with the segments 1.1 and 1.2 at either end. The operating principle of the actuator 4 can be of any form as long as it is able to exert forces on to the segments 1.1 and 1.2 of the rotary converter 1. The actuator 4 can be located in an interior cavity of the rotary converter 1, such that the rotary converter 1 with its support structure surrounds the actuator 4, as is represented in an exemplary manner in FIG. 1 and FIG. 2

All shapes and types of solid-state actuators and electromagnetic actuators can find application as the actuators 4. Examples of these include piezoelectric, magnetostrictive, electrostrictive, electrostatic and dielectric actuators, as well as all types of electromagnets. The actuator 4 is preferably one that can be electrically activated, wherein the latter can have electrical terminal connections 4.1 and 4.2. However, the actuator 4 can also be an actuator that can be influenced by other physical properties, e.g. a material that alters its length/volume with temperature, e.g. an expansion material, or a material that alters its shape under the influence of external electrical fields.

Such actuators that can be controlled by external fields do not necessarily need the electrical terminal connections 4.1 and 4.2, but electrical terminal connections can be present even in the case of such actuators, for example, for the registration of sensor properties.

If, for example, in the case of the example of embodiment shown as an actuator 4 in FIG. 1 and FIG. 2 a material is used with a very large alteration in length/volume with temperature, then the alterations in length of the actuator 4 in the direction of the z-axis brought about by alterations in temperature are converted into rotations proportional to temperature of the central segment 1.3 relative to the segments 1.1 and 1.2 at either end. Such a rotary actuator can serve for the temperature-controlled actuation of equipment, for example, valves, locking/unlocking devices, e.g. fire protection doors, other closure mechanisms, or also for temperature displays.

In particular, the rotary converter 1 has the properties of a spring, which lengthens or shortens in the event of tensile or compressive forces acting in the direction of the z-axis, wherein cross-sections of the rotary converter rotate relative to one another. By virtue of the spring action of the rotary converter 1, the latter can serve the purpose of connecting the actuator 4 under a mechanical pre-load with the rotary converter 1.

The spring action of the rotary converter 1 can be adjusted by the design of the arms and/or alteration of the number and length of the arms. In particular the arms on the periphery of the rotary converter can have a curved or a straight bar-type shape, or can be formed by the winding of planar structures about an axis, and/or can have articulations, in particular solid-body articulations.

A very extensive field of application for rotary converters in accordance with the invention is in conjunction with actuators controlled electrically. Upon the application of electrical signal voltages to the terminal connections 4.1 and 4.2 proportional forces are exerted onto the segments 1.1 and 1.2 at either end of the rotary converter 1 and can extend and/or compress the latter along the z-axis by amounts±ΔI. Such an actuator can, for example, be an electromagnet, which is arranged internal or external to the rotary converter 1, which when activated by current exerts forces acting in the direction of the z-axis, either via the end caps 2.1 and 2.2 or directly onto the segments 1.1 and 1.2 at either end. Piezoelectric actuators are particularly suitable for the rotary converter of the invention, since they are able to generate very high forces, are easy to control electrically and in static operation consume practically no electrical power.

Without limiting the generality, in what follows for purposes of representing the operating principle and further examples of embodiments of the inventive rotary converter, the assumption is made in the interests of clarity of the representation that the actuator 4 takes the form of a piezoelectric actuator, in particular a multi-layer piezoelectric stack, which in response to the application of electrical signal voltages to the terminal connections 4.1 and 4.2 executes alterations in length, preferably in the direction of the z-axis of the rotary converter 1.

The combination of the rotary converter and actuator is also designated as a rotary actuator.

The actuator 4 can be arranged so as to be internal or external to the rotary converter 1 and/or can surround the rotary converter 1. In particular the actuator 4, as in FIG. 1 and FIG. 2, can be arranged in an interior cavity of the rotary converter 1. In particular the actuator 4 can be supported in the z-direction on end caps 2.1 and 2.2 that are securely connected with the segments 1.1 and 2.2 at either end, so that axial movements of the actuator 4 in the z-direction are transferred via the end caps 2.1 and 2.2 onto the support structure of the rotary converter 1. The mounting 3 with its flanges 3.1 and 3.2 is preferably embodied to oppose this movement with only a little mechanical resistance, or, in the case of a single-ended mounting, with no mechanical resistance at all. By virtue of the mechanical spring action of the rotary converter 1, the latter can at the same time take on the function of a pre-loaded spring for the actuator 4. This is particularly advantageous in the case of solid-state actuators, for example piezoelectric actuators. To this end the rotary converter 1 can be lengthened by external aids to the desired value of the pre-load force, the end caps 2.1 and 2.2 and the piezoactuator 4 can be inserted into the rotary converter 1 and the end caps 2.1 and 2.2 can be securely connected in this position with the ring-shaped regions 1.1 and 1.2 of the rotary converter, for example, by welding, pressing, bonding or screwing.

The rotary converter has a working load 6 that is an object to be rotated, e.g. a mirror or an instrument, which is securely connected via a connecting element 5 with the segment 1.3 of the rotary converter 1.

The rotation of a working load 6 through an angle about the z-axis can be caused by the application of an electrical signal voltage to the terminal connections 4.1 and 4.2 of the actuator 4. The forces thereby exerted by the actuator 4 in the z-direction onto the segments 1.1 and 1.2 at either end extend or shorten the support structure of the rotary converter 1, depending on the amplitude and the magnitude of the electrical activation voltage, in the z-direction. As a result, the segments 1.1 and 1.2 increase or reduce their separation distance A in the z-direction. An extension of the rotary converter 1 in the z-direction leads to a reduction of the angle α that the arms 1.4 and 1.5 on the periphery of the rotary converter 1 subtend with the z-axis projected in parallel onto the periphery of the rotary converter. This leads to a rotation proportional to the change in the angle α of the central segment 1.3, also designated as the equator region, by the magnitude +φ about the z-axis relative to the segments 1.1 and 1.2 at either end of the rotary converter 1.

A connecting element 5 serves the purpose of transferring the rotation of the central segment 1.3 onto a working load 6, for example a projection mirror. Elements connects the working load 6 with the central segment 1.3.

In an analogous manner a compression of the rotary converter 1 leads to an increase of the angle α so that the arms 1.4 and 1.5 on the periphery of the rotary converter 1 subtend with the z-axis, and thus a rotation of the central segment 1.3 and the working load 6 connected with it by the magnitude −φ relative to the segments 1.1 and 1.2 at either end. Here the plane of the rotations±φ of the segments lies at right angles to the z-axis of the rotary converter 1. The functions of the mounting and working load are in principle interchangeable.

The inventive rotary actuator described in FIG. 1 and FIG. 2 permits a slim, compact and near-cylindrical build shape. However, the rotary converter 1 can also have regions or segments 1.1, 1.2 and 1.3 of differing diameter. For example, the central segment 1.3, also designated as the equator region, can possess a larger diameter compared with the segments 1.1 and 1.2, also designated as end regions. In conjunction with an actuator 4 of short build length, this leads to a flat build form; alternatively the end regions 1.1 and 1.2 can have a larger diameter compared with the equator region 1.3. In particular, the diameters of the various segments or regions, the angles that the various arm or support structures subtend on the periphery with the z-axis, and also the legs of the various arm or support structures, need not be identical. Rather a direction of rotation must just be established so that extensions and compressions of the rotary converter 1 brought about by an actuator lead to relative rotations of the various segments or ring-shaped regions of the rotary converter 1.

The structure of the rotary converter 1 of the invention effectively converts alterations in the length of the rotary converter 1 into rotational movements.

By a suitable choice of the arm angle α, the separation distance A and the diameter D, as shown in FIG. 1 and FIG. 2, the rotary converter can be dimensioned such that small alterations in length are converted into large angular movements. The choice of the parameters α, A and D and also the wall thickness and the arm shapes provides a large scope for design purposes, so that the inventive rotary converter can be matched to a multiplicity of actuators and requirements.

The low moment of inertia and high stiffness of the rotary converter 1 make possible a high dynamic response of the rotary actuator with, at the same time, high accuracy.

For a cylindrical rotary converter 1 of the type illustrated in an exemplary manner in FIG. 1 and FIG. 2, the following relationship approximately applies between the angle of rotation φ as a function of the alteration in separation distance±ΔI of the ring-shaped regions 1.1 and 1.2 at either end from the equator region 1.3:

$$i\phi[\text{Grad}]=360\cdot(A/(\pi\cdot D))\cdot[\text{SQRT}((1/\cos\alpha)^2-\text{SQRT}(((1/\cos\alpha)^2)-(1^{(G1.1)}\pm\Delta I/A)^2)) \quad \text{(Equn. 1)}$$

with the designations already used in FIG. 1 and FIG. 2:

±ΔI is the alteration in the separation distance of a ring-shaped region 1.1 and 1.2 at either end from the equator region 1.3

A is the neutral separation distance (actuator not activated by current) of the ring-shaped regions 1.1 and 1.2 at either end from the equator region 1.3

D is the diameter of the rotary converter 1

A is the neutral angle (actuator not activated by current) of the arms 1.4 and 1.5 on the periphery of the rotary converter relative to the z-axis of the rotary converter 1 parallel-projected onto the periphery FIG. 3 shows the angle of rotation φ calculated from Equn. 1 as a function of the alteration in length of the rotary converter, for a prescribed neutral separation distance of A=10 mm, and a prescribed diameter of the rotary converter of D=10 mm, for various neutral angles α of the arms. The sensitivity of the angle of rotation±φ to axial alterations in length±Δl increases with decreasing neutral angle α of the arms. With tensile forces the range of angle of rotation with decreasing neutral angle α of the arms is however constrained, since the arms that in the neutral position are already almost at right angles to the direction of the tensile force can only execute a small movement on the periphery of the rotary converter. With increasing neutral angle α of the arms the amplification factor with which the alterations in length of the rotary converter are converted into rotations is reduced. However, even for alterations in length of a few 10s of microns it is still possible to encompass a very large range of angles of rotation.

Figure 4:
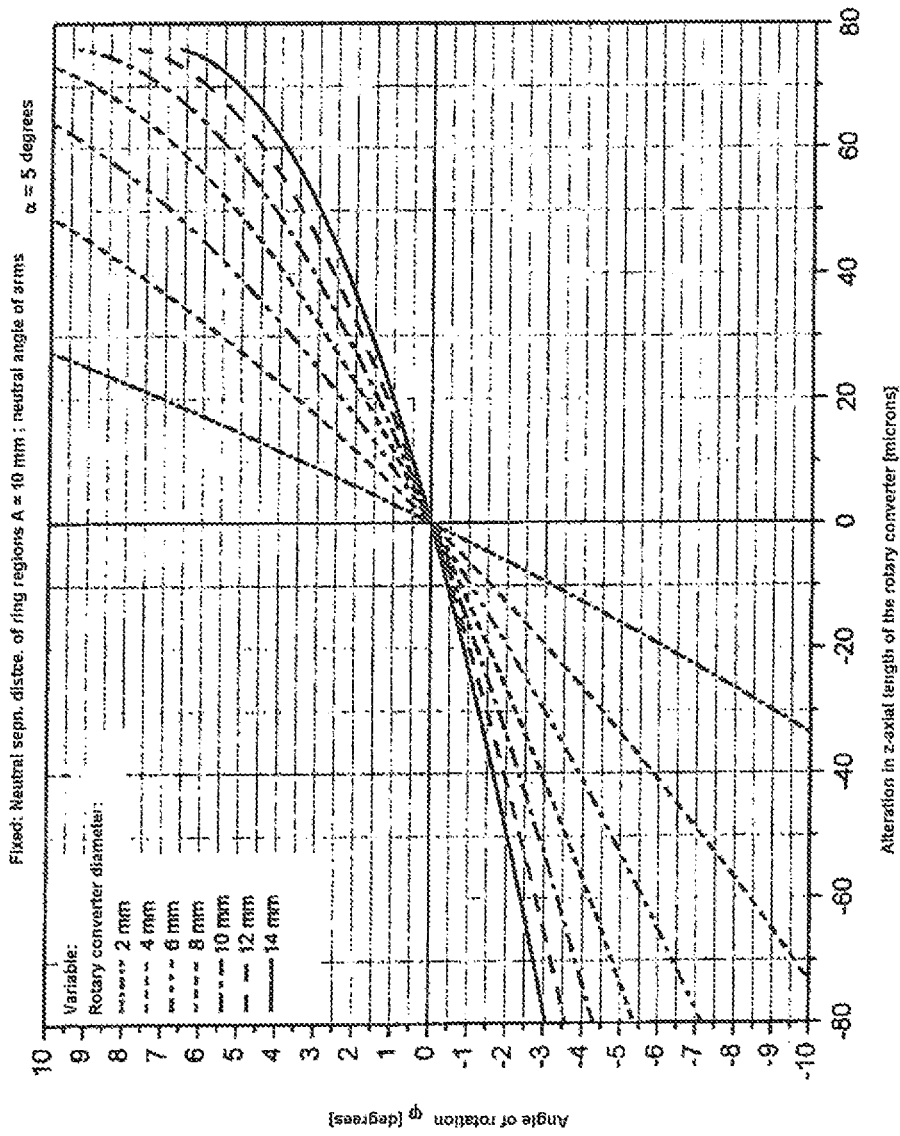
FIG. 4 is a graph of the angle of rotation for various diameters of a rotary converter.

FIG. 4 shows the influence of the diameter D of the rotary converter on the angle of rotation φ for a prescribed separation distance A=10 mm and a prescribed neutral angle for the arms of α=5°. In accordance with Equn. 1.1 and as shown in FIG. 4, axial alterations in length±Δl of the rotary converter are converted into angular movements more efficiently when the diameter D of the rotary converter is smaller. For a rotary converter with a diameter D=10 mm and an alteration in length of 40 μm, the angle of rotation amounts to 3.1°. By virtue of the 1/D proportionality of the angle of rotation twisted bar-type structures are particularly suitable for the inventive rotary converter.

Figure 5:
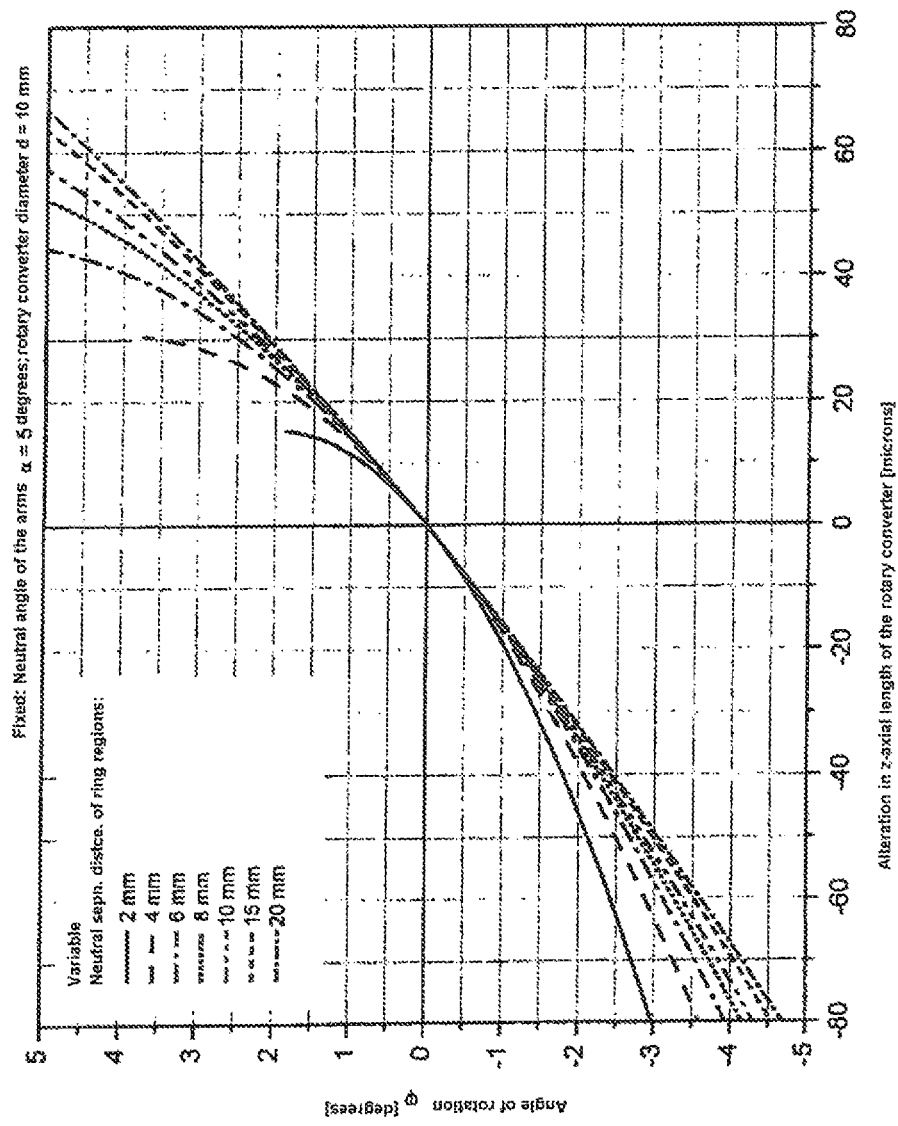
FIG. 5 is a graph of the angle of rotation for various separation distances of the ring-shaped segments of a rotary converter.

FIG. 5 shows the influence of the neutral separation distance A of the ring-shaped regions on the angle of rotation characteristic. By virtue of the stiffness of the rotary converter and for reasons of mechanical stability a design with arm lengths that are not too short is to be preferred.

Equn. 1 displays the effectiveness of the inventive rotary converter and shows its particular suitability for the conversion of longitudinal alterations in length into alterations in the angle of rotation.

The rotary converter 1 can, as in FIG. 1, have a cylindrical structure with the z-axis as the axis of symmetry. The fact that such structures can be projected onto a plane provides manufacturing advantages, since it makes possible the manufacture of the rotary converter from planar structures. In particular, the structure of the rotary converter in accordance with the invention can be generated in a cost-effective manner and in large numbers by stamping it out of, for example, a spring steel sheet, and the rotary converter can be manufactured by rolling the structure about the z-axis and the subsequent connection of the ends/abutting edges to form a cylindrical body. Welding, seaming and bonding processes are particularly suitable as connection techniques. However, the rotary converter can also be manufactured by means of mechanical, chemical, electrochemical, injection casting or laser-based methods, for example, by laser structuring, electrical erosion, milling, turning, or wet and/or dry etching processes.

Figure 6:
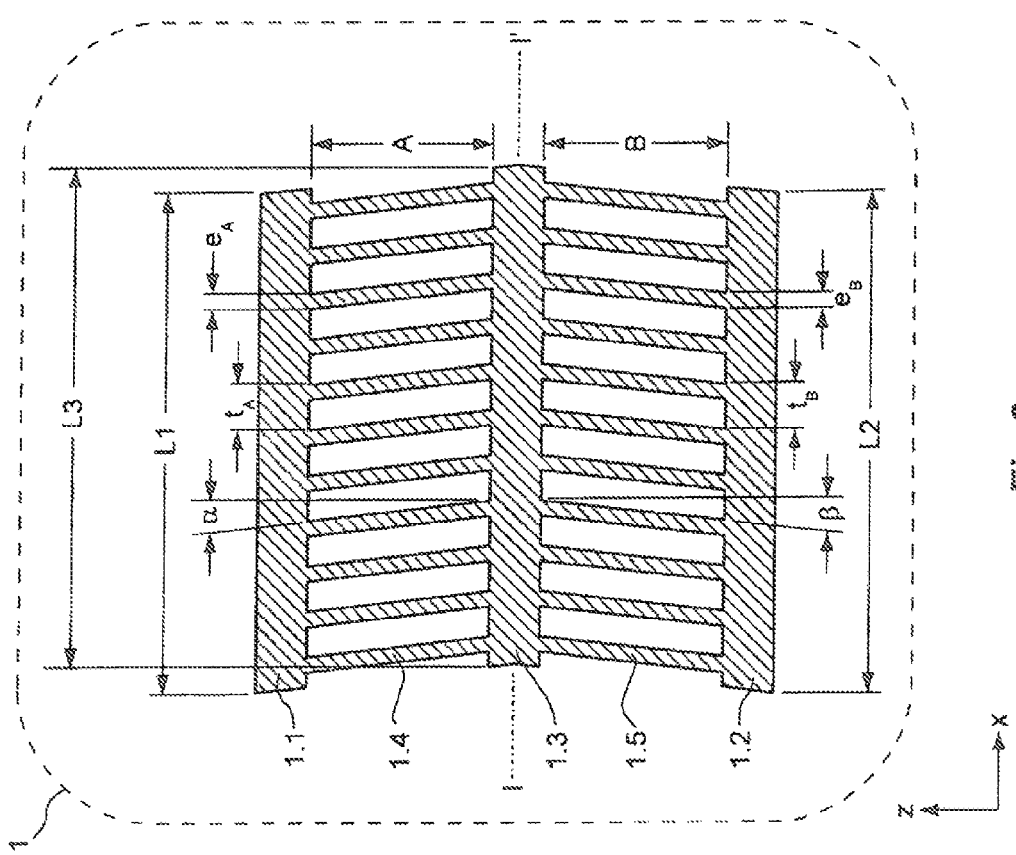
FIG. 6 illustrates a support structure projected onto the plane of a cylindrical rotary converter with arms being directly connected with ring-shaped segments.

FIG. 6 shows a cylindrical rotary converter that has been cut open on the periphery along its z-axis of symmetry and developed onto the xz-plane. The planar rotary converter structure represented in FIG. 6 can have different thicknesses in various regions along the y-axis at right angles to the xz-axis. The rotary converter 1 projected onto the plane as in FIG. 6 has two strip-shaped regions 1.1 and 1.2 at either end and a central strip-shaped equator region 1.3. The regions 1.1 and 1.3 are spaced apart from one another along the z-axis by the dimension A and are connected together by arms 1.4, which are oriented at an angle α with respect to the z-axis. Similarly the regions 1.2 and 1.3 are spaced apart from one another along the z-axis by the dimension B and are connected together by arms 1.5, which are oriented at an angle β with respect to the z-axis. In particular the structure of the rotary converter 1 shown in FIG. 6 has a mirror symmetry with respect to a central axis I-I' oriented in the x-direction, so that |α|=|β|. By this means a fishbone-like structure results with respect to the axis of symmetry I-I'. If the rotary converter has a cylindrical shape, the lengths L1, L2 and L3 of the strip-shaped regions 1.1, 1.2 and 1.3 are identical. The arms 1.4 have the width $e_A=\cos(\alpha)$ and are arranged at a pitch $t_A$ along the x-axis. The arms 1.5 have the width $e_B=\cos(\beta)$ and are arranged at a pitch $t_B$ along the x-axis. The planar rotary converter structure illustrated in FIG. 6 can be wound around the z-axis to form a cylindrical body with the diameter D=(L/π), with L=L1=L2=L3.

The high degree of symmetry of the rotary converter structure shown in FIG. 6 offers manufacturing and functional advantages. The invention, however, can also be applied to structures with other and/or the lower degrees of symmetry. For example, for (L1=L2)≠L3, or (L1=L3)≠L2, or (L2=L3)≠L1, or L1≠L2≠L3 cone-shaped forms of the rotary converter ensue. With various angles α and β, with various distances A and B, with various pitches $t_A$ and $t_B$, with various, e.g. curved, shapes of the arms 1.4 and 1.5 and also various widths of the arms 1.4 and 1.5, a large number of embodiments of the inventive rotary converter result over a wide design spectrum.

Figure 7:
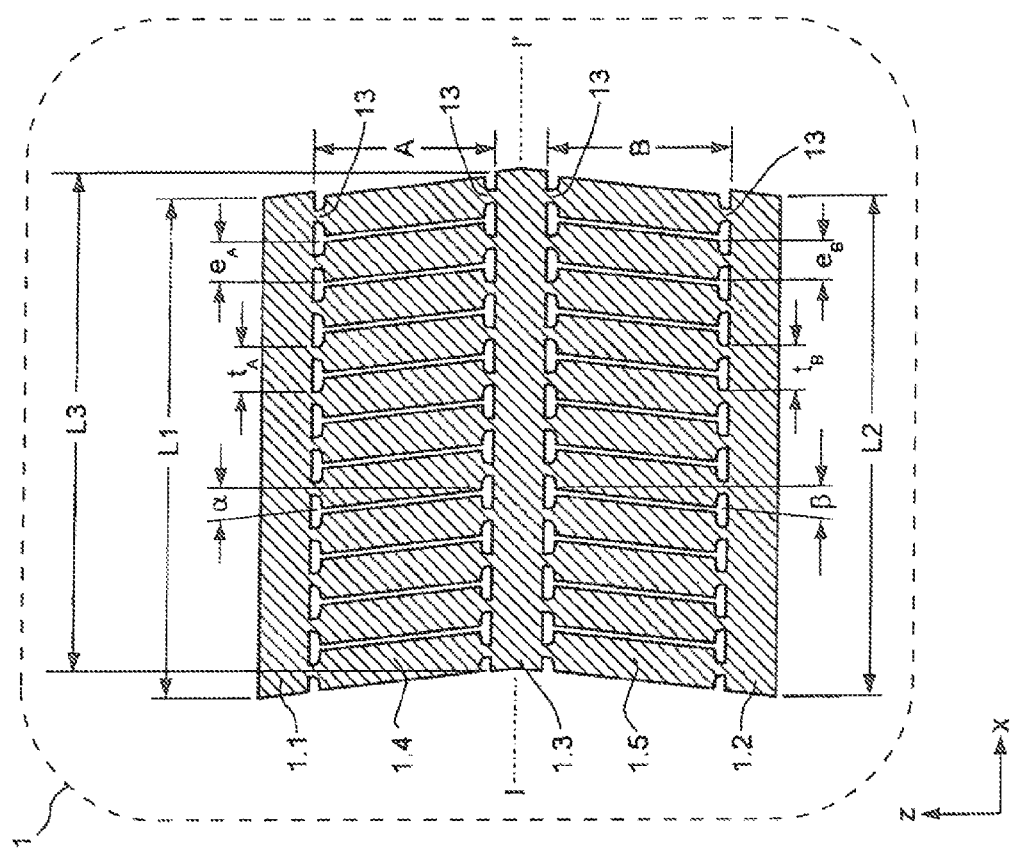
FIG. 7 shows a support structure projected onto the plane of a cylindrical rotary converter with arms having attached to the ring-shaped segments with solid-body articulations.

In order to convert small forces and/or deflections of the actuator 4 into large rotational movements, it is advantageous if the arms 1.4 and 1.5 have a low extensibility in their longitudinal direction, but are flexible in bending with respect to movements on the periphery of the rotary converter about the z-axis. As represented in FIG. 7 this can be achieved by connecting the arms 1.4 and 1.5 with the ring-shaped or strip-shaped regions 1.1, 1.2 and 1.3 via solid-body articulations 13. The solid-body articulations 13 are configured in the form of constrictions (width, thickness, length) of the arms 1.4 and 1.5 which oppose rotational movements of the ring-shaped regions or linear movements on the periphery of the rotary converter with only a little mechanical resistance. Compared with the widths $(t_B-e_B)$ and $(t_A-e_A)$ of the solid-body articulations 13, the actual arms 1.4 and 1.5 can have a greater width and thus a high resistance to extension. At the same time the thickness of the arm structures can be reduced in the region of the solid-body articulations. Instead of solid-body articulations, traditional forms of mounting, such as ball bearings, needle bearings, sliding bearings, etc., can also find application.

FIG. 8a) and FIG. 8b) show individual components of the rotary actuator of the invention and their arrangement in perspective and planar views. These can have ring-shaped regions 1.1, 1.2 and 1.3, arms 1.4 and 1.5, a header plate 2.1, a footer plate 2.2 with feed-through passages 8, and an actuator 4 with electrical terminal connections 4.1 and 4.2. FIG. 8c) shows an assembled rotary actuator, but without a mounting and without a working load.

The function of the rotary converter is based on relative rotations of the individual ring-shaped regions of the rotary converter about the z-axis. In the case of the example of embodiment as in FIG. 1 the equator region 1.3 rotates relative to the ring-shaped regions 1.1 and 1.2 at either end in the event of an alteration in length of the rotary converter. In the inventive rotary actuator, in particular in all forms of embodiment represented, the functions of a mounting 3 and a working load 6 are interchangeable and are simply a matter of the definition of the inertial system. In FIG. 1, for example, the working load 6 can also be coupled to the regions 1.1 and 1.2 at either end, and the equator region 1.3 can be attached in a stationary manner.

FIG. 9a) and FIG. 9b) show two views of a rotary actuator that is only connected with the mounting 3 at one end. Here the functions of mounting 3 and working load 6 can be interchanged with one another. That is, the rotary converter 1 can also be connected on the equator region 1.3 with a stationary housing, and the working load rather than the mounting 3 can be attached to the rotary converter.

For the operating stability of an actuator 4, it can be advantageous to protect the latter from environmental influences, in particular moisture. To this end the rotary actuator of the invention can have a protective casing 7 as a further element which surrounds and hermetically seals the actuator 4 in the form of a sleeve, as is shown in FIG. 10 in a sectional view. FIG. 11 shows the rotary actuator in FIG. 10 in an external view.

Figure 12:
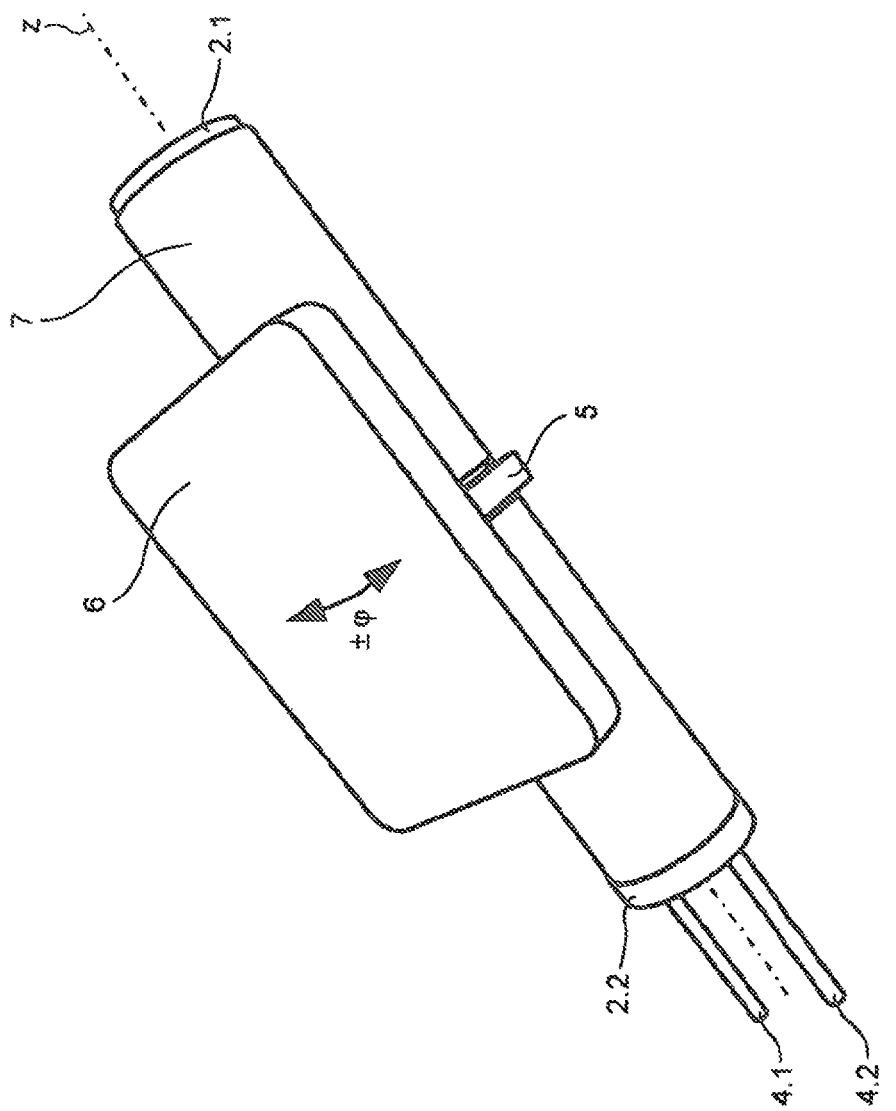
FIG. 12 illustrates a perspective image of a rotary actuator with an outer hermetically sealed encasement.

The rotary actuator represented in FIG. 10 and in FIG. 11 has an electrical actuator 4 with electrical terminal connections 4.1 and 4.2, a bellows-type structure 7, a rotary converter 1, a header plate 2.1 and a footer plate 2.2 with electrically insulated feed-through passages 8. A mechanical flexibility of the protective casing 7 in the direction of the z-axis is achieved, for example, by a corrugated wall structure, as is illustrated by the bellows-type structure 7 in FIG. 10. The actuator 4 is located flush with the end faces of the header plate 2.1 and the footer plate 2.2, preferably under a mechanical pre-load. The mechanical pre-load can be applied by the rotary converter 1 and/or the bellows 7. The mechanical connection of the elements is symbolically indicated by welding and/or bonding seams 10. However, other connection techniques are also suitable for this purpose. The detail view A in FIG. 10 shows the mechanical connections of the footer plate 2.2 with the rotary converter 1 and the bellows 7 by means of welding or bonding seams 10, and also the electrical feed-through passages 8 of the terminal connection pins 4.1 and 4.2 of the actuator 4. In the example of embodiment shown in FIG. 10, the actuator 4 is hermetically sealed by a bellows 7 located in the interior of the rotary converter 1 surrounding the actuator 4. To this end the bellows 7 is connected at its ends in a hermetically sealed manner with the end plates 2.1 and 2.2. A mechanical and hermetically sealed connection of the bellows 7 with the end caps 2.1 and 2.2 can be achieved by methods known in the art such as welding, bonding, pressing, or elastomer seal elements, such as, for example, O-rings. For the connection of the ring-shaped regions 1.1 and 1.2 at either end of the rotary converter 1 a multiplicity of connection and joining processes of known art are available. For purposes of ensuring a hermetic seal, the feed-through passages 8 of the electrical terminal connections 4.1 and 4.2 through the end plate 2.2 are similarly hermetically sealed, as is shown in the detail view A in FIG. 10. The sealant 8 can at the same time have the function of an electrical insulator. The elastic protective casing 7 is either a gas-tight material, or at least a material that acts as a diffusion barrier to gases, in particular, water and water vapor. The interior cavity 9 of the elastic protective casing 7, in which the actuator 4 is located, is advantageously evacuated and/or filled with a dry protective gas. Here the protective casing 7 can lie flush against the actuator 4 or can remain spaced apart from the latter. The protective casing 7 can both be located within the rotary converter 1, as shown in FIG. 10, and can surround the latter externally, as represented in FIG. 12. In particular, all types of organic and inorganic coatings and also material compounds of the same are suitable for the elastic protective casing 7. Examples of these include paints, plastics, glasses, ceramics, metals, metal alloys and elastomers. The protective casing 7 can also have a smooth or structured thin-wall or bellows-type structure, which opposes the alteration in length of the rotary actuator 1 in the z-direction with only a small mechanical resistance. For the hermetic sealing of the actuator 4, the protective casing 7 can also surround the rotary converter 1, as illustrated in FIG. 12, so it lies against the rotary converter 1, or can be spaced apart from the latter. For purposes of protection, the rotary converter 1 can, for example, be externally extrusion coated with a plastic, or can be covered with a hose-type or sleeve-type entity. Also the rotary converter 1 can itself have a hermetically sealed wall.

FIG. 11 shows the rotary converter in FIG. 10 in the assembled state. In the interests of clarity the mountings are not shown in FIG. 10, FIG. 11 and FIG. 12. To operate the rotary actuator electrical voltages are applied to the terminal connections 4.1 and 4.2 of the actuator 4. By this, the actuator 4 alters its length and exerts forces onto the header plate 2.1 and the footer plate 2.2, preferably in the direction of the z-axis as the axis of symmetry of the rotary actuator. By virtue of the spring action of the rotary converter 1 and bellows 7, the forces exerted by the actuator 4 lead to an alteration of length, both of the actuator 4 and also of the elements connected with it of rotary converter 1 and bellows 7 along the z-axis. As a result, the equator region 1.3 rotates relative to the regions 1.1 and 1.2 at either end. A mounting and a working load can be attached both in the region of the header plate 2.1, the footer plate 2.2 or from header plate 2.1 and footer plate 2.2, and also on the equator region 1.3 of the rotary converter. The functions of the mounting and working load are in principle interchangeable.

Hermetic sealing of the at least one actuator 4 can be applied in all inventive embodiments of the rotary actuator, or rotary converter.

The actuator 4 can also be composed of a plurality of individual actuators, wherein the individual actuators have separate electrical terminal connections, or these can be electrically connected into groups, or into a single actuator. In particular, the rotary actuator of the invention also allows the use of a plurality of actuators with differing operating principles for purposes of operating the rotary converter. To this end, for example, electromagnetic actuators can operate together with piezoelectric actuators for purposes of actuating the rotary converter.

In particular. the rotary converter can also be embodied as a micro electromechanical system (MEMS), as a micro system technical component or a micro-mechanical component. For purposes of operating the rotary converter electrostatic, electrothermal, dielectric (polymer actuators), and also electropneumatic, magnetic shape memory (MSM) and magnetostrictive actuator principles and actuators are suitable, as are all types of physical and/or chemical actuators. The function of the rotary converter is thus not restricted to any particular actuator principle.

In the example of embodiment of a rotary actuator shown in FIG. 12, the rotary converter is surrounded by an elastic hermetically sealed sleeve 7. In particular, the hermetically sealed sleeve 7 is applied externally to the rotary converter 1 can be a thin-walled tube, or a hose-type entity of a very wide variety of materials, such as for example a coated or an uncoated plastic film. For purposes of increasing the impermeability to diffusion, coating of the elastic sleeve with metals or metal alloys is particularly suitable. A hermetically sealing sleeve 7 can also be manufactured by extrusion coating of the rotary converter 1 with a plastic or compound.

Figure 14:
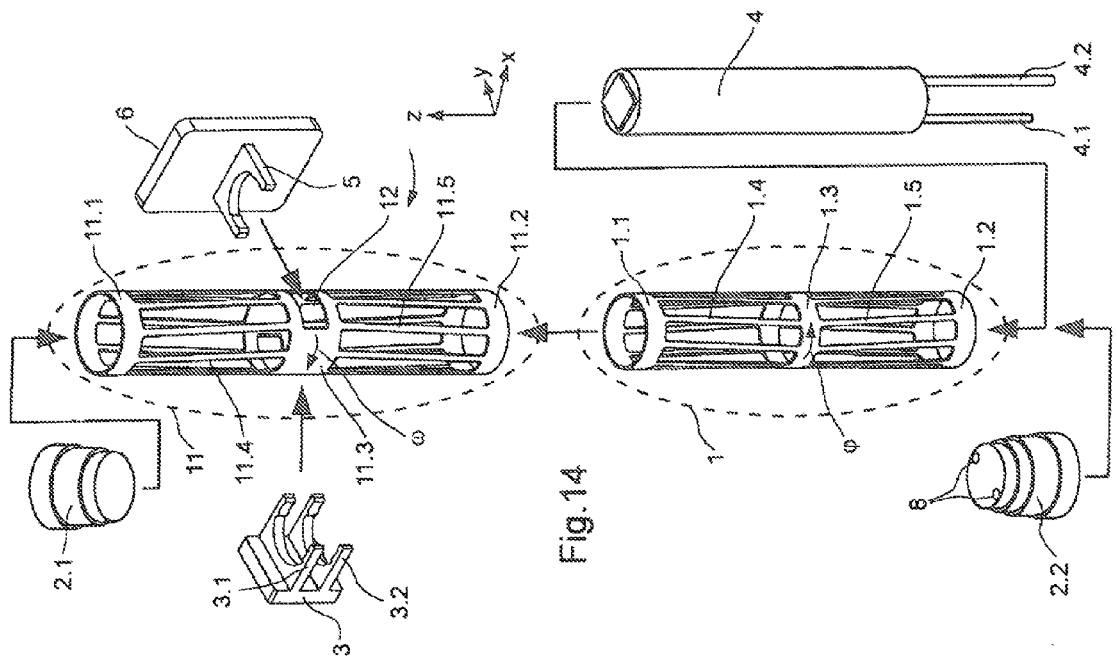
FIG. 14 illustrates a representation of individual components of the double-acting rotary actuator of FIG. 13.
Figure 13:
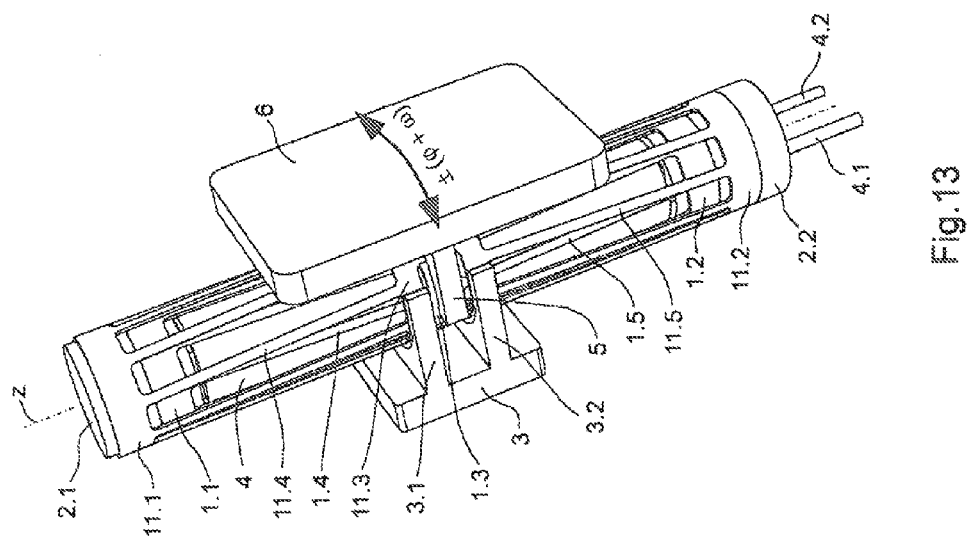
FIG. 13 illustrates a perspective view of a rotary actuator with a double-acting rotary converter.

For purposes of amplifying the rotational movement, the rotary converter can have a plurality of rotary converters which are driven by a common actuator or by a plurality of actuators, and operate together such that the rotational movements of the individual rotary converters are superposed, that is to say either added or subtracted. To this end FIG. 13 and FIG. 14 show an example of embodiment, in which an actuator 4 drives a first rotary converter 1, having the regions 1.1 to 1.5, and a second rotary converter 11, having the regions 11.1 to 11.5. The outer diameter of the rotary converter 1 is smaller than the inner diameter of the rotary converter 11, so that the rotary converter 1 can be inserted into the rotary converter 11. Both rotary converters 1 and 11 act on a common header plate 2.1 and on a footer plate 2.2, with which they are mechanically connected, if required under a mechanical pre-load. The double-acting principle of the rotary actuator represented in FIG. 13 and FIG. 14 is based on the fact that in the event of extension or compression in the same direction of the two rotary converters with respect to the header and footer plates 2.1 and 2.2, the equator region 1.3 of the rotary converter 1 and the equator region 11.3 of the rotary converter 11 rotate about the z-axis in opposite directions. This behavior is achieved by an opposed orientation of the arm angles of the two rotary converters, as illustrated in FIG. 13 and FIG. 14. If the arms 1.4 of the rotary converter 1 subtend a positive angle on its periphery with the z-axis, then the arms 11.4 of the rotary converter 11 subtend a negative angle with the z-axis. The same is true for the angular orientation of the arms 1.5 of the rotary converter 1 with respect to the angular orientation of the arms 11.5 of the rotary converter 11. With a given alteration in length of the actuator 4 there thus follows a rotation of the equator region 1.3 of the rotary converter 1 by $+\phi$ and at the same time an opposed rotation of the equator region 11.3 of the rotary converter 11 by $\omega$, such that the equator regions 1.3 and 11.3 rotate relative to one another by the angle $(\phi+\omega)$. If the two rotary converters have identical properties then the angular rotation in comparison to that of an individual rotary converter doubles to $2\phi$. For purposes of establishing mechanical contact, for example of a working load 6 or a mounting on the equator region 1.3 of the rotary converter 1, the equator region 11.3 of the rotary converter 11 has the at least one recess 12, as shown in FIG. 14, through which the connecting element 5 can be connected with the equator region 1.3. The connecting element 5 and recess 12 are dimensioned such that within the desired range of angles of rotation any contact of the connecting element 5 with the rotary converter 11 is avoided. A working load is either connected with the connecting element 5, or is connected in a stationary manner, e.g. with a housing (not illustrated). In an analogous manner, the mounting 3 is connected using at least one of the connecting elements 3.1 and 3.2 with the equator region 11.3 of the rotary converter 11. The mounting 3 can also represent a working load, or such a working load can be connected with the latter. The amplified rotational movement is a rotation of the equator regions 1.3 and 11.3 relative to one another, or of the connecting elements 5 and 3.1 and 3.2 connected with the equator regions 1.3 and 11.3. Which of the connecting elements is connected with a stationary housing and to which the working load is applied is solely a question of the reference system and is irrelevant for the function of the rotary actuator.

Figure 15:
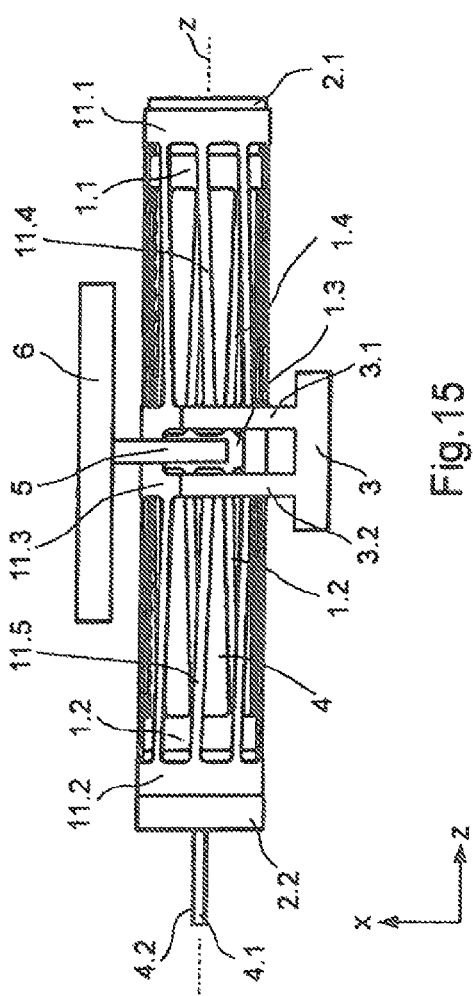
FIG. 15 a side view of the rotary actuator of FIG. 13.
Figure 16:
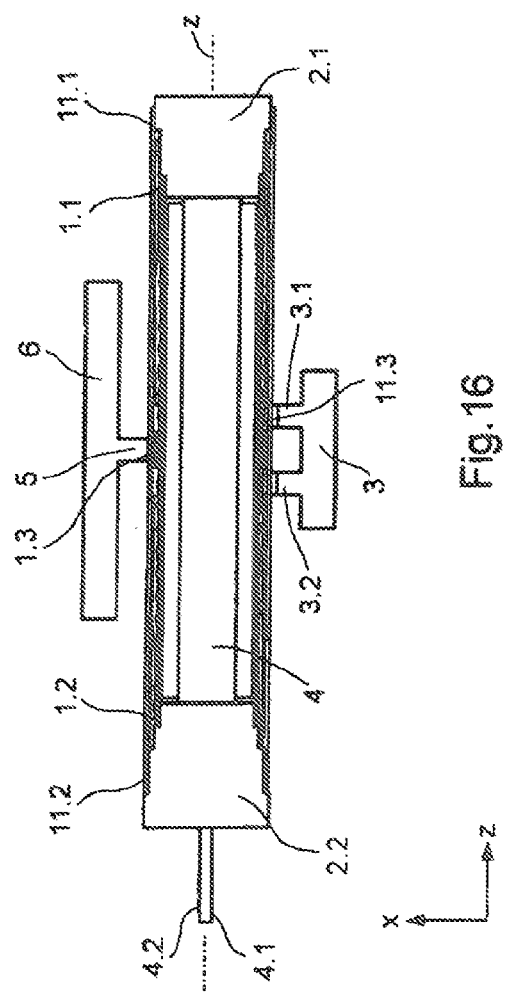
FIG. 16 shows a cross-sectional representation of the rotary actuator of FIG. 13.
Figure 17:
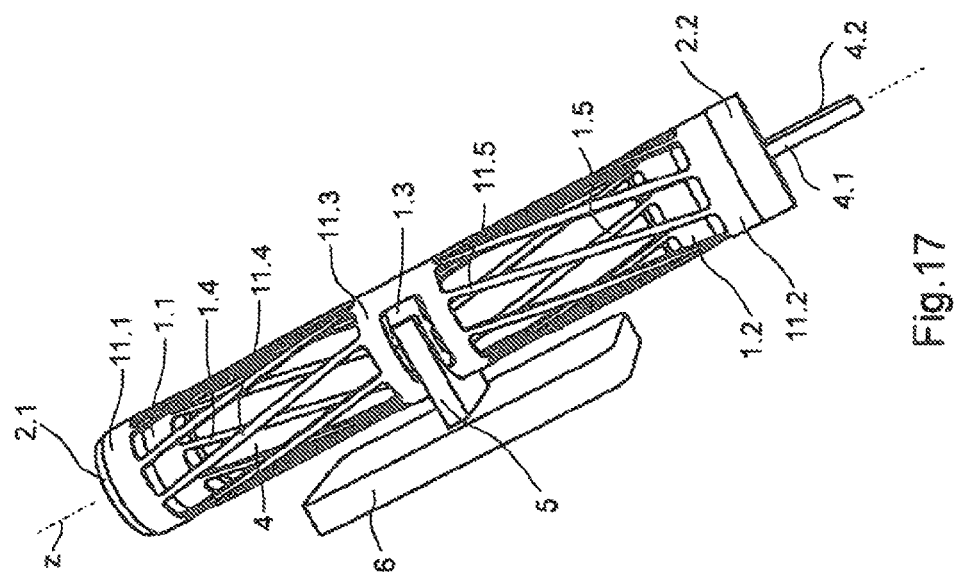
FIG. 17 illustrates a perspective image of the rotary actuator of FIG. 13 without a mounting.

For purposes of further illustration of the build and mode of operation, FIG. 15 shows a side view; FIG. 16 a cross-sectional representation; and FIG. 17 shows a perspective view of the double-acting rotary actuator. In particular, the opposed interlacing of the arm structures 1.4 to 11.4 and 1.5 to 11.5 of the two rotary converters 1 and 11 emerges from FIG. 15 and FIG. 17, as does the nested build of the two rotary converters 1 and 11 within one another. The common attachment of the two rotary converters 1 and 11 to the header plate 2.1 and footer plate 2.2 can also be seen from FIG. 16 and FIG. 17, as can the arrangement of the actuator 4.

FIG. 18 shows a further example of embodiment of the rotary actuator of the invention with an actuator 4 arranged so as to be external to the rotary converter 1, wherein FIG. 18a) shows a side view and FIG. 18b) shows a perspective view. The actuator 4 and the rotary converter 1 are oriented parallel to a z-axis, and are attached at one end in each case to the base plate 3. A support 15 is located at right angles to the base plate 3 which at its end faces away from the base plate 3 is an articulation 13. The articulation 13 is advantageously designed as a solid-body articulation, but can also be a traditional pivot bearing, e.g. a ball bearing. The rotary articulation 13 is connected with a lever 16. One end of the lever 16 is connected with the end 1.1 of the rotary converter 1 facing away from the base plate 3. To this end the rotary converter 1 can be directly connected with the lever 16, or the rotary converter 1 at its lever end can have a header plate, which is connected with the lever 16 via a push rod. The other end of the lever 16 is connected with the end of the actuator 4 facing away from the base plate 3. For the introduction of force from the actuator 4 into the lever 16, the former can also have a push rod 14. With the application of electrical voltages to the terminal connection pins 4.1 and 4.2, the actuator 4 generates forces, that is deflections, acting predominantly in the direction of the z-axis, which are introduced via the push rod 14 into the lever 16. The forces generated by the actuator 4, with the lever ratio y1/y2, and the deflections, with the reciprocal lever ratio y2/y1, are introduced into the rotary converter 1, wherein y1 designates the distance from the rotary articulation 13 to the force introduction point of the actuator 4, and y2 designates the distance from the rotary articulation 13 to the force introduction point in the rotary converter 1. If y2>y1, the deflections of the actuator 4 are introduced with the lever ratio y2/y1 in an amplified manner into the rotary converter. By the choice of a suitable lever transmission ratio, the force/path characteristic of the actuator 4 can be adapted to the mechanical properties of the rotary converter 1. In particular, small deflections of the actuator 4 with high levels of force, e.g. of a piezoelectric actuator, can be converted by the lever in a simple manner into larger deflections with lower levels of force, and in this manner large rotational movements of an element 6, for example a mirror, connected with the rotary converter 1 can be generated. The lever transmission ratio can, however, also be ≤1. By means of the spatial separation of rotary converter 1 and actuator 4 an additional degree of freedom with respect to the type, embodiment, and build of rotary converter 1 and actuator 4 is achieved.

FIG. 19 shows the example of embodiment of a rotary converter that has only one arm structure 1.4 connecting the upper ring-shaped region 1.1 with the lower ring-shaped region 1.2. The arms 1.4 are inclined relative to the z-axis projected onto the periphery of the rotary converter. FIG. 19a) represents a plan view; FIG. 19b) is a cross-section; and FIG. 19c) is a perspective view of the rotary converter. An axial alteration in length of the actuator 4 by the application of electrical signal voltages to the terminal connections 4.1 and 4.2 of the actuator 4 leads to a rotation, proportional to the alteration in length, of the ring-shaped regions 1.1 and 1.2 relative to one another and about the z-axis. The actuator 4 transfers the forces, that is, deflections, that it has generated via a pivot bearing formed from the elements 17 and 18 onto the header plate 2.1. The element 17 has the function of a bearing shell, which can centrally accommodate a ball 18 in order to transfer the forces/deflections generated by the actuator 4 onto the header plate 2.1 as a second bearing shell. By this a low resistance rotation is made possible of the header plate 2.1 and the ring-shaped region 1.1 of the rotary converter 1 that is connected with the header plate relative to the footer plate 2.2 and the ring-shaped region 1.2 that is connected with the footer plate. With the fixing of the footer plate 2.2 with a mounting 3 that is assumed to be stationary, the header plate 2.1 and the working load, for example. a mirror, connected via a connecting element 5 with the header plate, rotate about the z-axis with activation of the actuator 4. The pivot bearings 17 and 18 introduced between actuator 4 and header plate 2.1 is particularly advantageous in the case of solid-state actuators, and can be omitted in the case of actuators that transfer forces onto the footer plate 2.1 and the header plate 2.2 via field effects. Examples of such actuators are electromagnets, electrostatic actuators or hydraulic or pneumatic actuators.

FIG. 20*a*) and FIG. 20*b*) show an alternative embodiment of the rotary actuator with a simple arm structure and lever transmission, in which the actuator 4 is located to be external to the rotary converter 1. The transfer of the forces generated by the actuator 4 onto the rotary converter 1 takes place by means of the lever 16 mounted by means of the pivot bearing 13. The actuator 4 introduces the forces/deflections via the push rod 14 into the lever 16 which are translated with the lever ratio y2/y1 and are transferred through the ball 18 onto the rotary converter 1. The lever ratio y2/y1 enables an adaptation of the path/force characteristic of the actuator 4 to the rotary converter 1. By means of the ball 18, the pivot bearing permits rotations about the z-axis of the region 1.1 and the elements that are connected with the latter, namely the connecting piece 5 and working load 6.

For purposes of increasing the range of the angle of rotation about an axis a plurality of rotary converters can be assembled.

The previous examples of embodiments have served in particular to provide an electrically controlled generation of rotational movements about an axis. Rotational movements about a plurality of axes can easily be generated by a combination of a plurality of rotary actuators. To this end, for example, a first rotary actuator generates rotational movements about a first axis. For purposes of generating rotational movements about a second axis that does not run parallel to the first a second rotary actuator is attached to the first rotary actuator as a working load such that its axis of rotation does not run parallel to the axis of rotation of the first rotary actuator. It is particularly advantageous if the individual axes of rotation of the rotary actuators are orthogonal to one another. In the same manner further rotary actuators can be introduced so as to enable rotations about further spatial axes.

Rotational movements about a plurality of axes can also be generated in the examples of embodiment in FIG. 21*a*) and FIG. 21*b*) in the manner shown. The two-axis rotary actuator represented in FIG. 21 can generate both rotations of a working load 6 about a first z-axis, and also rotations of the working load 6 about a second y-axis. The two-axis rotary actuator has two rotary actuators 1 and 1' in accordance with the invention, which are arranged axially one behind another in a common mounting 3 and have the z-axis as a common axis of symmetry. Each of the two rotary actuators 1 and 1' can be individually electrically activated via the electrical terminal connections 4.1 and 4.2 and 4.1' and 4.2' respectively. The mounting 3 with its end flanges 3.1 and 3.1' is dimensioned such that it opposes the axial movements of the actuators 4 and 4' with only a small mechanical resistance. The actuators 4 and 4' are supported on a common central region 3.12 of the mounting 3. Each of the rotary actuators has the ability to generate rotational movements of its equator region 1.3 and 1.3'. The working load 6 is connected via connecting elements 14 and 14' that are flexible in bending, for example, pins, and the mechanical connecting pieces 5 and 5' with the equator regions 1.3 and 1.3'. The connecting pieces 5 and 5' are mechanically stiff, so that the rotational movements of the equator regions 1.3 and 1.3 are introduced via the pins 14 and 14' into the working load 6.' The region 3.12 of the mounting 3 and the connecting pieces 5 and 5' are spaced apart from one another and do not make contact with each other. For purposes of generating rotational movements 'Ω of the working load 6 about the y-axis running at right angles to the z-axis of symmetry, both actuators 4 and 4' are activated in the same direction, that is both actuators are shortened, or both actuators are lengthened, By virtue of the anti-symmetry of the two rotary converters structures in FIG. 21, chosen only as an example, this leads to rotational movements of opposite direction +φ, −ω or −φ, +ω of the equator regions 1.3 and 1.3' about the z-axis; by means of the pins 14 and 14' these movements are transferred onto the working load 6 and rotate the latter about the y-axis by an angular amount. If the two actuators 4 and 4' are electrically activated in the opposite sense the result is a rotation +φ, +ω or −φ, −ω of the equator regions 1.3 and 1.3' in the same direction. This leads to a rotation ψ of the working load 6 about the z-axis. The arrangement as presented can execute rotational movements of a working load about two spatial axes Ω, ψ controlled and monitored by electrical means.

Similarly in the example of embodiment illustrated in FIG. 21 of a two-axis rotary actuator. it is possible to arrange the actuators to be external to the rotary converters, as is made clear by the example of embodiment in FIG. 22*a*) and FIG. 22*b*). The deflections generated by the actuators 4 and 4' are introduced via pivoted levers 16 and 16', as already described in FIG. 18, into the rotary converters 1 and 1' with an increased or a decreased stroke. Solid-body articulations preferably find application as the pivot bearings 13 and 13'. By means of mechanical springs, the actuators 4 and 4' can be pre-loaded in compression and with the aid of an encasement can be hermetically protected against environmental influences. In FIGS. 18 and 22, the mechanical pre-load mechanism is illustrated in the form of tube-shaped springs 4 and 4'. No further explanation of the mode of operation is provided since this is analogous to that of the example of embodiment in FIG. 21.

Bar-shaped structures can also serve as inventive rotary converters. For this purpose straight bar-shaped structures of any cross-section that connect the ring-shaped regions 1.1, 1.2, 1.3 . . . and 1.*x* are suitable, as are spatially curved bar-shaped structures. In particular there are also structures that are suitable for the rotary converter, which originate from the rotation of a base surface of any shape, which can also be a hollow profile, along an axis of development, and about this axis, so that under the action of tensile and/or compressive forces onto the bar-shaped structure, their cross-sectional regions along the axis of development alter their angular location. Such structures can, for example, also be manufactured by extrusion presses and/or a twisting process. Actuators that can be electrically actuated preferably serve the purpose of generating the actuation forces onto the rotary converters.

The form of the rotary converter is therefore not limited to cylindrical, hollow cylindrical, or conical forms of the type presented; rather this can have any profile shape, in particular of box-shaped, circular-shaped or star-shaped hollow or solid profiles, which are twisted through an angle along an axis. Examples for such forms of embodiment of the rotary converter are represented in FIG. 23, wherein the left-hand image in each case shows only the wall profile of the rotary converter and the right-hand image in each case shows the rotary converter wall profile with disk-shaped end regions. FIG. 23a) shows a box-shaped hollow profile, FIG. 23b) shows an elliptical hollow profile and FIG. 23 b.) shows a star-shaped solid profile. In each case these profiles have been twisted along a z-axis. The profiles represented have the property of bar springs, which with the action of tensile and/or compressive forces alter their length, wherein the cross-sections of the bar structure located at right angles to the z-axis rotate relative to one another. Expressed in a simplified manner, the twisted bar structures are straightened by tensile forces which the angle of twist being reduced. Compressive forces exert a compression when the angle of twist is increased. By the attachment of a mounting and a working load at a distance from one another along the z-axis, a rotation of the working load with respect to the mounting is generated sot that the bar structures fulfil the function of the rotary converters of the invention as described. Instead of the hollow cylindrical rotary converter structures, as shown, for example in FIG. 8, structures of the type generated from twisted bars, hollow profiles or other cross-sections in the manner described can also be rotary converters in accordance with the invention.

The rotary converters in the form of bar springs can, in a manner analogous to that of the previously described rotary converters, be embodied with an anti-symmetrical twist with respect to a central equator plane 1.3. FIG. 24a) shows a corresponding example of embodiment for a box-shaped hollow profile, FIG. 24b) shows an elliptical hollow profile; and FIG. 24c) shows a star-shaped solid profile. Here the central plane of symmetry corresponds to the equator region 1.3 of the hollow cylindrical rotary converter from for example FIG. 1. That is to say, in the event of extension and/or compression of the bar spring along the z-axis, the equator region 1.3 rotates relative to its regions 1.1 and 1.2 at either end. The wall structures 1.4 and 1.5 are anti-symmetrical with respect to the equator plane. In particular, in the examples of the embodiment shown in FIG. 24 they have a mirror symmetry. By the combination of bar spring segments 1.4, 1.5 . . . and 1.x with various angles of twist, various directions of rotation, various lengths and various profiles a multiplicity of rotary converter structures can be represented. In particular, the cross-section of the bar springs can also alter along the z-axis. For example, it can increase or decrease in size, and/or can migrate from one type of cross-section into another.

The connection of the rotating and the stationary regions of a rotary converter in accordance with the invention can take place via both straight and also spatially curved structures. FIG. 25a) shows an example of the latter case, in which the wall of the rotary converter has spirally curved strip-shaped arms 1.4, which are arranged about a z-axis with rotational symmetry. FIG. 25b) shows this rotary converter with disks 1.1 and 1.2 attached at either end, by which an actuator (not illustrated), generates forces preferably acting axially in the z-direction introduced, as a result of which the regions 1.1 and 1.2 rotate relative to one another.

By the combination of two rotary converter structures with opposed directions of twist of the type shown in FIG. 25a) and FIG. 25b), the example of embodiment shown in FIG. 26 is obtained, in which with the application of axial force the central equator region 1.3 rotates relative to the regions 1.1 and 1.2 at either end.

By electronic measures, the angle of rotation characteristic of the rotary actuator of the invention can be influenced in the desired manner, in particular it can be linearized. The behavior with temperature can also be optimized in this manner, and a mode of operation that is independent of temperature over a range of temperatures can be achieved. In particular by such electronic correction measures in the case of multi-axis rotary actuators, a decoupling of the axes of rotation can be achieved. By use of electronic signal evaluation units, which register current, voltage and charge, any reactions can be detected and the dynamic and static behavior can be improved. For example, any overshoots can be minimized or prevented and/or any contact between the working load and an object can be detected. The detection of force feedback onto the working load is very important particularly in the fields of medical technology and robotics. In particular the inventive rotary actuator can be operated within a closed control circuit, for example for purposes of static and/or dynamic tracking of objects. The object that can be adjusted by the rotary actuator of the invention is preferably part of the control circuit, for example a mirror that transfers optical signals onto receiving equipment, for example a CCD camera or photosensors, so that nominal deviations can be registered and compensation can occur.

The electrical signal registration and evaluation enables furthermore automatic monitoring of the correct mode of operation and increases the operational security and stability.

Alongside deflection and projection systems of all types the rotary actuators of the invention are particularly suitable for the manipulation of objects, wherein the described electronic signal evaluation in addition enables the registration of real-time force feedback. Such applications are to be found in many technical and industrial sectors, including production and automation technology, in the assembly and joining of items, in medical technology in particular operation robotics, in aerospace technology for the registration of aerodynamic forces, or in automotive and building technology as obstruction protection systems.

By virtue of the ability of the rotary actuators of the invention to rotate and pivot even working loads of significant mass with high accuracy and dynamic response, they are particularly suitable in the sector of driver information systems (head-up displays). An HUD is an optical system that introduces information, for example concerning speed or for navigation purposes, into the visual field of the driver of a motor vehicle. An HUD can have the components of light source, light modulator (TFT, LCD, DLP, micro-deflection mirror), optical elements such as lenses and mirrors, and electronic and electromechanical items for purposes of adjustment. There are systems on the market in which the optical information is reflected directly into the windscreen, and those in which the optical information is reflected onto an optical semi-transparent disk, designated as a combiner, which by means of electromechanically actuated kinematics is positioned into the visual field of the driver. In today's systems the kinematics often have electric motors, often coupled with transmissions made up of cam plates, racks, gears, guide rails and similar mechanical components and motor control electronics. in many cases the main mirror, designated as a combiner, is guided in a guide rail or a motion link and is traversed outwards by the electromechanical components along the guide rail into the visual field of the driver, or in the idle state is traversed inwards into the HUD. In a manner corresponding to the various driver parameters it is desirable that the combiner can assume a variety of positions. The electromechanical system that is required for this purpose, having numerous components, is susceptible to faults, is cost intensive, requires a large build space, generates noise in operation and does not permit sufficient dynamic adjustment.

In addition to a quasi-static adjustment, new methods desire a dynamic and/or adaptive adjustment of the combiner and/or other optical components of a driver information system so as to ensure, even with alterations of the eye positions of the driver, a distortion-free, high-intensity and correct display of the optical information. For example, by following the eye positions of the driver by an eye tracking system a control circuit can be constructed, so that the optical components can be tracked in a suitable manner. Today's HUD systems do not provide the dynamic response and accuracy necessary for this purpose.

Projection systems (beamers, back projectors, displays, etc) and so-called DLP devices (digital light processing) which could be suitable for this purpose, have significant limitations. DLPS are based on micro-electromechanical systems (MEMS) and have an array of micro-mirrors, so-called DMDs (digital micromirror devices) that can be individually activated electrically, including electrostatic activation. Texas Instruments offers DLP devices for a very wide variety of applications. In these the light from a light source is reflected by micro-mirrors of the DMDs in discrete spatial directions. The micro-mirrors of the DMDs can be switched at a high frequency between two discrete positions, for example between +12° and −12°. There is no analogous adjustment of the mirrors of an electrostatically switched DMD in the known prior art. If in a neutral position only a part of the active mirror surface of a DMD is used for the display of optical information, the projected image can in principle be moved within the surface of the DMD that is not used in the neutral position. With imaging optics of a HUD, alterations in the viewing position of, for example, a motor vehicle driver, can in this manner be corrected within limits. Since here other regions of the combiner and the other optical components of the HUD, such as ancillary mirrors, lenses, etc are illuminated, these must be appropriately over-dimensioned. However, any increase in size of the optical elements is undesirable in terms of build space and cost.

Figure 27:
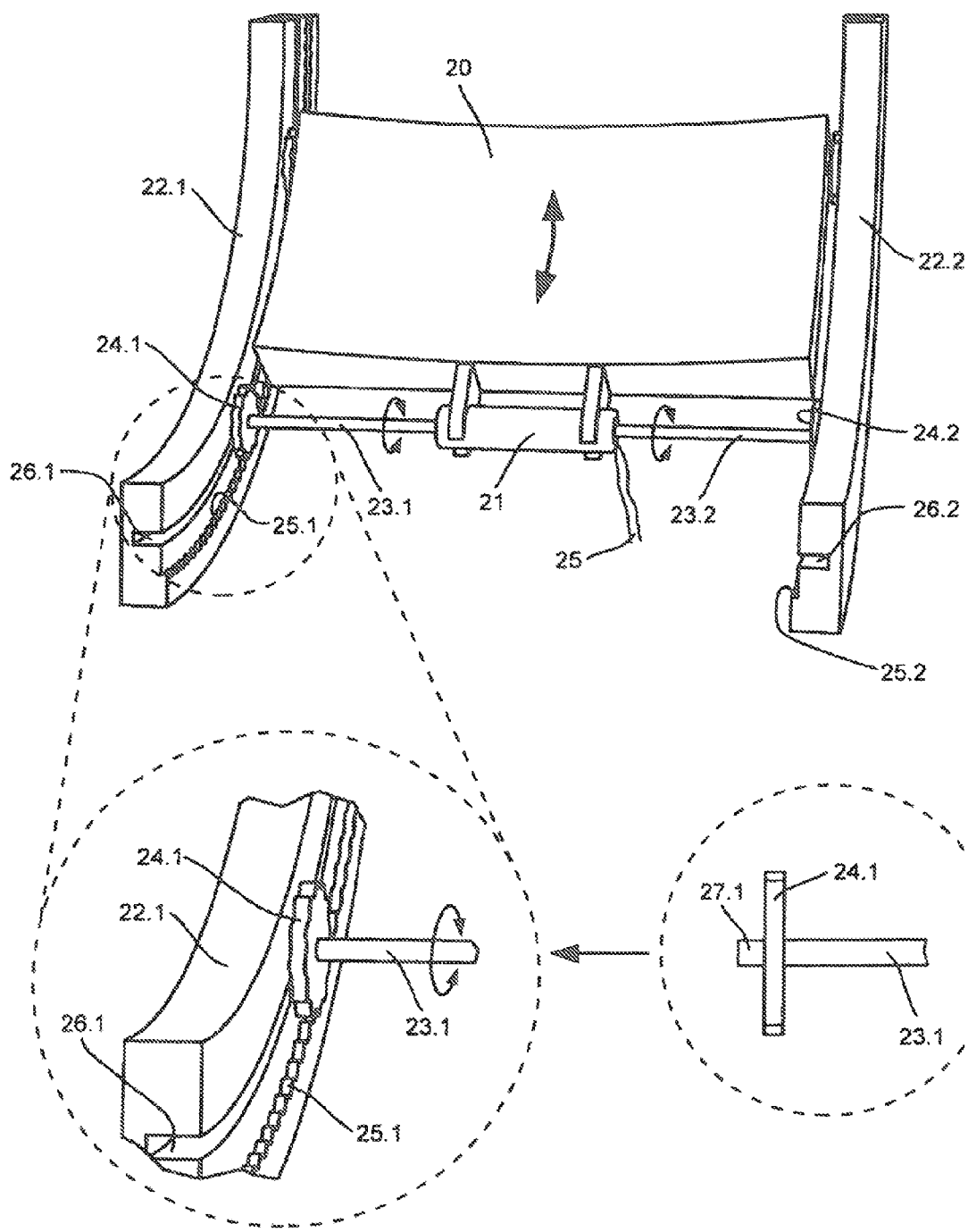
FIG. 27 illustrates a head-up display (HUD) with a main mirror (combiner) driven directly by an on-board electric motor.

In accordance with the invention this task, as represented in FIG. 27, is solved by means of an electric motor, attached to the combiner, moving with the latter, and operable in a controlled manner, wherein the inventive rotary actuator can be used for the dynamic adjustment of the optical components. The optical components, in particular the combiner 20, are directly moved and positioned in a guide rail 22 by an electric motor 21 controlled electrically, attached to and on-board the combiner 20. The on-board electric motor 21 has for this purpose at least one shaft 23.1 with a gear 24.1, which is in engagement with teeth 25.1 on the guide rail 22.1. Advantageously the on-board electrical motor 21 has two shafts 23.1 and 23.2, or one continuous shaft with two gears 24.1 and 24.2 and two toothed guide rails 22.1 with 25.1, and 22.2 with 25.2, so that each of the gears is in engagement with one guide rail. To ensure the engagement of the motor shafts 23.1 and 23.2 in the teeth 25.1 and 25.2 of the guide rails 22.1 and 22.2, the motor shafts can have in each case a pin-shaped protrusion 27.1 and 27.2, with which they slide in grooves 26.1 and 26.2 of the guide rails.

The on-board electric motor 21 can be connected with the motor control electronics via, for example, a flexible cable 25, for example, a Kapton cable, or the guide rails 22.1 and 22.2 can have electrical contact tracks, from which the electrical signals for the motor can be extracted via contact sliders. The invention makes possible an extremely compact, reliable, cost-effective and low noise drive of the combiner and/or other components of a driver information system, wherein for purposes of adjustment of the optical components, in particular the combiner, the combiner is adjusted by the on-board drive motor in a quasi-stationary mode, and is dynamically adjusted by the inventive rotary actuator, not illustrated in FIG. 27.

If the optical drive information is generated, for example, by a DLP, LED, or LCD projection system, the rotary actuator of the invention can serve to provide the static and/or dynamic alignment of the optical elements, without the need for the rotary actuator to be increased in size.

The rotary actuator of the invention enables miniaturization, new functionalities and a lower complexity for such systems. A rotary actuator with a piezoelectric actuator is advantageously also energy-efficient, since it consumes electrical power only when in dynamic operation, and can maintain positions without any power consumption.

By virtue of the high accuracy, high dynamic response and compact build, the rotary actuator of the invention is particularly suitable for the precise and dynamic movement of inertial objects.

The invention claimed is:

1. A rotary actuator comprising:
   segments which are spaced apart and are connected by at least one support structure and at least one actuator for providing forces and wherein
   the support structure is rotationally symmetry about an axis, includes elements which are not oriented parallel to the axis, or which are twisted about an angle with respect to the axis, and the elements are changed relative each other by rotation about the axis and the actuator when actuated exerts forces on the segments and/or the support structure in the direction of the axis.

2. The rotary actuator in accordance with the claim 1, comprising:
   a support structure surrounding the actuator or is disposed externally to the actuator.

3. The rotary actuator in accordance with claim 2, comprising:
   at least two support structures arranged coaxially relative to one another, and wherein
   at least one segment of one support structure is connected with at least one segment of another support structure.

4. The rotary actuator in accordance with claim 2, comprising:
   a plurality of support structures which are at least one of being nested within one another and arranged one behind another along the axis.

5. The rotary actuator in accordance with claim 4, comprising:
   at least two support structures arranged coaxially relative to one another, and wherein
   at least one segment of one support structure is connected with at least one segment of another support structure.

6. The rotary actuator in accordance with claim 4, wherein:
   elements of one support structure and elements of another support structure have a mirror symmetry relative to a vertical plane of the axis through the segments which are connected.

7. The rotary actuator in accordance with claim 2, wherein:
   at least one of the segments is connected with a stationary object and at least one other segment is connected with a moving object.

8. The rotary actuator in accordance with claim 1, comprising:
   a plurality of support structures which are at least one of being nested within one another and arranged one behind another along the axis.

9. The rotary actuator in accordance with claim 8, comprising:
- at least two support structures arranged coaxially relative to one another, and wherein
- at least one segment of one support structure is connected with at least one segment of another support structure.

10. The rotary actuator in accordance with claim 8, wherein:
- elements of one support structure and elements of another support structure have a mirror symmetry relative to a vertical plane of the axis through the segments which are connected.

11. The rotary actuator in accordance with claim 8, wherein:
- at least one of the segments is connected with a stationary object and at least one other segment is connected with a moving object.

12. The rotary actuator in accordance with claim 1, comprising:
- at least two support structures disposed coaxially relative to one another, and wherein
- at least one segment of one support structure is connected with at least one segment of another support structure.

13. The rotary actuator in accordance with claim 12, wherein:
- elements of one support structure and elements of another support structure have a mirror symmetry relative to a vertical plane of the axis through the segments which are connected.

14. The rotary actuator in accordance with claim 12, wherein:
- at least one of the segments is connected with a stationary object and at least one other segment is connected with a moving object.

15. The rotary actuator in accordance with claim 1, wherein:
- elements of one support structure and elements of another support structure have a mirror symmetry relative to a vertical plane of the axis through the segments which are connected.

16. The rotary actuator in accordance with claim 15, wherein:
- at least one of the segments is connected with a stationary object and at least one other segment is connected with a moving object.

17. The rotary actuator in accordance with claim 1, wherein:
- at least one of the segments is connected with a stationary object and at least one other segment is connected with a moving object.

18. The rotary actuator in accordance with claim 1, wherein:
- the at least one actuator is an electrically controlled actuator operating as a solid-state, a piezoelectric, or a magnetostrictive, an electromagnetic, an electrostatic or a dielectric elastomer actuator.

19. The rotary actuator in accordance with claim 1, comprising:
- at least one of an hermetically sealed encasement of the at least one actuator and an hermetically sealed support structure.

20. The rotary actuator in accordance with claim 1, wherein:
- the support structure comprises a spring providing a spring rate oriented along the axis.

21. The rotary actuator in accordance with claim 1, wherein:
- the support structure mechanically pre-loads the actuator.

22. The rotary actuator in accordance with claim 1, comprising:
- a plurality of electrical actuators which are individually activated.

23. A rotary actuator in accordance with claim 1, comprising:
- optical components in a driver information system of optical components which are adjusted by the rotary actuator.

24. A method for the operation of a rotary actuator including segments which are spaced apart and are connected by at least one support structure and at least one actuator for providing forces; the support structure being rotationally symmetrical about an axis and including elements which are not oriented parallel to the axis, or which are twisted about an angle with respect to the axis and the elements are changed relative each other by rotation about the axis and the actuator when actuated exerts forces on at least one of the segments and the support structure in the direction of the axis comprising:
- electrically activating at least one actuator segment or moving objects connected to the segments to execute rotational movements relative to one another which are proportional to at least one of an amplitude and a polarity of activation signals of the at least one actuator.

25. The method of operation of a rotary actuator in accordance with claim 24, comprising:
- operating the rotary actuator within or as part of a control circuit.

* * * * *